(12) United States Patent
Hamada

(10) Patent No.: US 12,422,746 B2
(45) Date of Patent: Sep. 23, 2025

(54) PHOTOSENSITIVE COMPOSITION, CURED FILM, COLOR FILTER, LIGHT SHIELDING FILM, OPTICAL ELEMENT, SOLID-STATE IMAGING ELEMENT, INFRARED SENSOR, AND HEADLIGHT UNIT

(71) Applicant: FUJIFILM Corporation, Tokyo (JP)

(72) Inventor: Daisuke Hamada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 483 days.

(21) Appl. No.: 17/902,894

(22) Filed: Sep. 4, 2022

(65) Prior Publication Data

US 2023/0025715 A1   Jan. 26, 2023

Related U.S. Application Data

(63) Continuation of application No. PCT/JP2021/005784, filed on Feb. 17, 2021.

(30) Foreign Application Priority Data

Mar. 6, 2020   (JP) .................................. 2020-039004

(51) Int. Cl.
G03F 7/004 (2006.01)
F21S 41/40 (2018.01)
(Continued)

(52) U.S. Cl.
CPC ............ *G03F 7/0042* (2013.01); *F21S 41/40* (2018.01); *F21S 41/43* (2018.01); *G03F 7/0005* (2013.01);
(Continued)

(58) Field of Classification Search
CPC ...... G03F 7/0042; G03F 7/0043; G03F 7/027; G03F 7/033; F21S 41/40
See application file for complete search history.

(56) References Cited

U.S. PATENT DOCUMENTS

2015/0331315 A1* 11/2015 Yang ...................... G03F 7/029
523/400
2020/0183051 A1   6/2020 Taguchi
2021/0115219 A1   4/2021 Inoue et al.

FOREIGN PATENT DOCUMENTS

JP   2010218596   9/2010
WO  2019059359   3/2019
WO  2019065143   4/2019

OTHER PUBLICATIONS

Kovalev et al., Distribution of impurities in ceramics based on zirconium nitride obtained using the oxidative constructing approach (Year: 2020).*

(Continued)

*Primary Examiner* — John S. Chu
(74) *Attorney, Agent, or Firm* — JCIPRNET

(57) ABSTRACT

The present invention provides a photosensitive composition with which a cured film having excellent patterning properties and excellent electrode anticorrosion properties can be produced. In addition, it also provides a cured film formed of the photosensitive composition, a color filter, a light shielding film, an optical element, a solid-state imaging element, an infrared sensor, and a headlight unit.

The photosensitive composition of the present invention contains a zirconium nitride-based particle containing one or more selected from the group consisting of zirconium nitride and zirconium oxynitride a resin, a polymerizable compound, and a photopolymerization initiator, in which the zirconium nitride-based particle contains 0.001% to 0.400% by mass of a Fe atom with respect to a total mass of the zirconium nitride-based particle.

16 Claims, 5 Drawing Sheets

(51) Int. Cl.
*F21S 41/43* (2018.01)
*G03F 7/00* (2006.01)
*G03F 7/027* (2006.01)
*G03F 7/028* (2006.01)
*G03F 7/033* (2006.01)
*H10F 39/00* (2025.01)
*F21S 41/683* (2018.01)

(52) U.S. Cl.
CPC ............ *G03F 7/0007* (2013.01); *G03F 7/027* (2013.01); *G03F 7/028* (2013.01); *G03F 7/033* (2013.01); *H10F 39/8057* (2025.01); *F21S 41/683* (2018.01)

(56) References Cited

OTHER PUBLICATIONS

"International Search Report (Form PCT/ISA/210) of PCT/JP2021/005784," mailed on Apr. 20, 2021, with English translation thereof, pp. 1-5.
"Written Opinion of the International Searching Authority (Form PCT/ISA/237) of PCT/JP2021/005784," mailed on Apr. 20, 2021, with English translation thereof, pp. 1-6.

* cited by examiner

PHOTOSENSITIVE COMPOSITION, CURED FILM, COLOR FILTER, LIGHT SHIELDING FILM, OPTICAL ELEMENT, SOLID-STATE IMAGING ELEMENT, INFRARED SENSOR, AND HEADLIGHT UNIT

CROSS-REFERENCE TO RELATED APPLICATIONS

This application is a Continuation of PCT International Application No. PCT/JP2021/005784 filed on Feb. 17, 2021, which claims priority under 35 U.S.C. § 119(a) to Japanese Patent Application No. 2020-039004 filed on Mar. 6, 2020. The above application is hereby expressly incorporated by reference, in its entirety, into the present application.

BACKGROUND OF THE INVENTION

1. Field of the Present Invention

The present invention relates to a photosensitive composition, a cured film, a color filter, a light shielding film, an optical element, a solid-state imaging element, an infrared sensor, and a headlight unit.

2. Description of the Related Art

A light shielding film called a black matrix is provided in a color filter that is used in a liquid crystal display device for the purpose of, for example, shielding light between colored pixels to enhance contrast.

In addition, currently, a compact and thin imaging unit is mounted on a mobile terminal of electronic apparatus such as a mobile phone and a personal digital assistant (PDA). A light shielding film is provided in a solid-state imaging element such as a charge coupled device (CCD) image sensor and a complementary metal-oxide semiconductor (CMOS) image sensor for the purpose of, for example, preventing the generation of noise and improving image quality.

For example, WO2019/059359A discloses a coloring resin composition containing (A)alkali-soluble resin, (B) coloring material, (C) organic solvent, and (D) photosensitizer, where the coloring resin composition contains at least a zirconia compound particle as the (B) coloring material, and a crystallite size of zirconium nitride contained in the zirconia compound particle is 10 nm or more and 60 nm or less, where the crystallite size is determined from a half-width of a peak derived from a (111) plane in an X-ray diffraction spectrum in a case where a CuKα ray is used as an X-ray source (claim 1 and paragraph 0012). Such a coloring resin composition is described as being excellent in light shielding properties in the visible region and suitable for a black matrix and the like (paragraphs 0012, 0112, and the like).

SUMMARY OF THE INVENTION

A composition containing particles containing zirconium may be used for forming a cured film processed into a patterned manner, on a substrate on which an electrode pattern is formed.

However, as a result of applying a composition containing zirconium-containing particles onto a substrate on which an electrode pattern was formed to prepare a cured film formed in a patterned manner, the inventors of the present invention revealed that the deterioration (the corrosion) of the electrode pattern occurs or the desired pattern cannot be obtained (patterning properties are decreased) depending on the kind of the zirconium-containing particles.

Accordingly, an object of the present invention is to provide a photosensitive resin composition with which a cured film having excellent patterning properties and excellent electrode anticorrosion properties can be produced. In addition, another object thereof is to provide a cured film formed of the photosensitive composition, a color filter, a light shielding film, an optical element, a solid-state imaging element, an infrared sensor, and a headlight unit.

As a result of carrying out extensive investigations, the inventors of the present invention have found that the above objects can be achieved by the following configuration and have completed the present invention.

[1] A photosensitive composition comprising:
a zirconium nitride-based particle containing one or more selected from the group consisting of zirconium nitride and zirconium oxynitride;
a resin;
a polymerizable compound; and
a photopolymerization initiator,
in which the zirconium nitride-based particle contains 0.001% to 0.400% by mass of a Fe atom with respect to a total mass of the zirconium nitride-based particle.

[2] The photosensitive composition according to [1], in which the zirconium nitride-based particle contains 0.010% to 0.150% by mass of the Fe atom with respect to the total mass of the zirconium nitride-based particle.

[3] The photosensitive composition according to [1] or [2], in which the zirconium nitride-based particle contains a Cl atom.

[4] The photosensitive composition according to [3], in which a content of the Cl atom is 0.001% to 0.300% by mass with respect to the total mass of the zirconium nitride-based particle.

[5] The photosensitive composition according to [3] or [4], in which in the zirconium nitride-based particle, a mass ratio of a content of the Fe atom to a content of the Cl atom is 0.008 to 1.5.

[6] The photosensitive composition according to any one of [1] to [5], in which the zirconium nitride-based particle contains a core portion containing one or more selected from the group consisting of zirconium nitride and zirconium oxynitride, and a metal oxide coating layer consisting of a metal oxide that covers the core portion.

[7] The photosensitive composition according to [6], in which the metal oxide includes silica or alumina.

[8] The photosensitive composition according to any one of [6] or [7], in which a content of the metal oxide coating layer is 3% to 7% by mass with respect to the total mass of the zirconium nitride-based particle.

[9] The photosensitive composition according to any one of [1] to [8], further comprising a black pigment.

[10] A cured film that is formed from the photosensitive composition according to any one of [1] to [9].

[11] A light shielding film that is the cured film according to [10].

[12] A color filter comprising the cured film according to [10].

[13] An optical element comprising the cured film according to [10].

[14] A solid-state imaging element comprising the cured film according to [10].

[15] An infrared sensor comprising the cured film according to [10].

[16] A headlight unit for a vehicle, comprising:
a light source; and
a light shielding unit that shields at least a part of light emitted from the light source, in which the light shielding unit includes the cured film according to [10].

According to the present invention, it is possible to provide a photosensitive composition with which a cured film having excellent patterning properties and excellent electrode anticorrosion properties can be produced. In addition, the present invention can also provide a photosensitive composition, a cured film formed of the photosensitive composition, a color filter, a light shielding film, an optical element, a solid-state imaging element, an infrared sensor, and a headlight unit.

DESCRIPTION OF THE PREFERRED EMBODIMENTS

Figure 1:
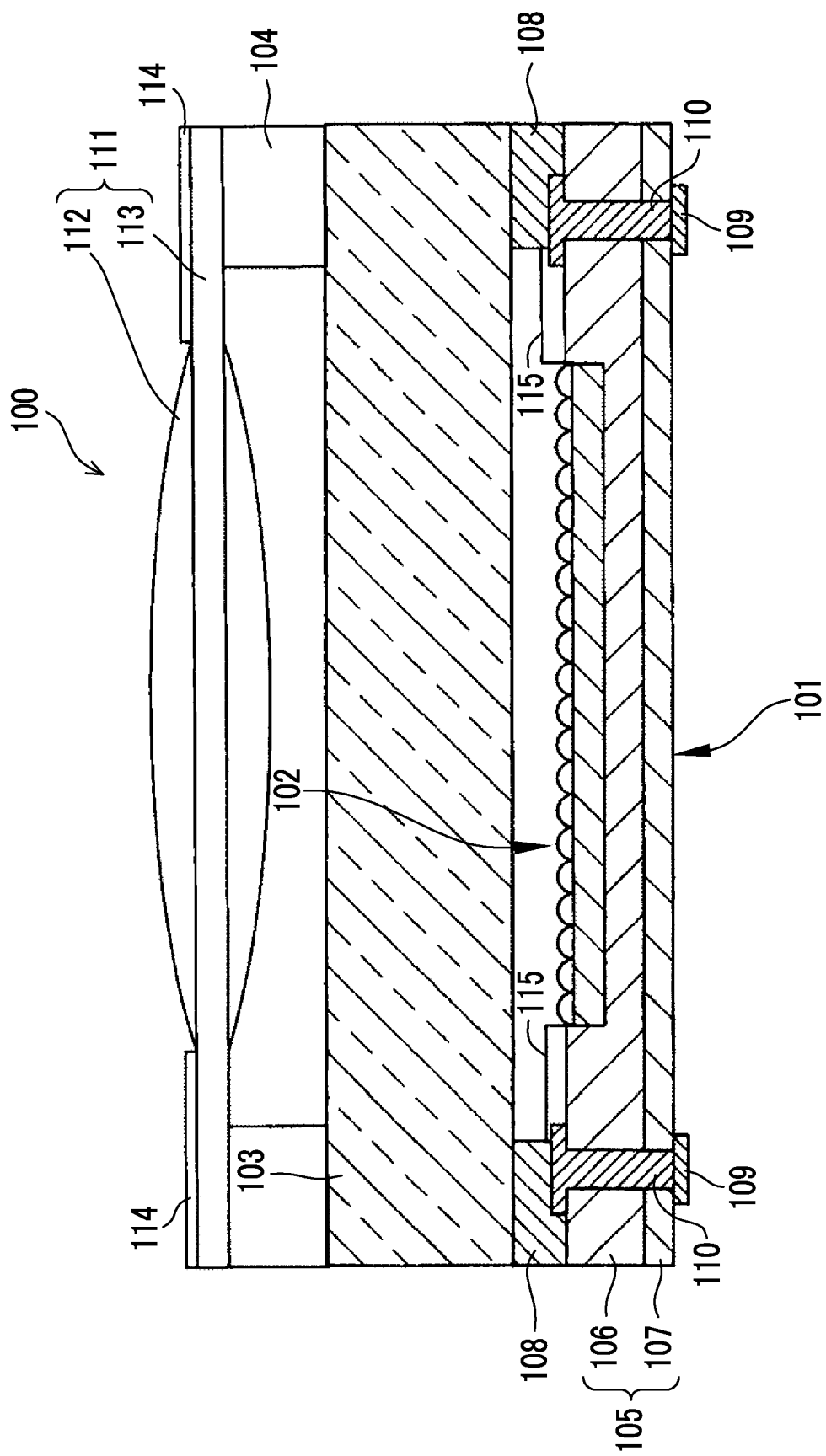
FIG. 1 is a schematic cross-sectional view illustrating an example of a configuration of a solid-state imaging device.

Hereinafter, the present invention will be described in detail.

The description of the following configuration requirements is made based on representative embodiments of the present invention in some cases; however, the present invention is not limited to the embodiments.

It is noted that in the present specification, a numerical value range expressed using "to" means a range including numerical values described before and after "to" as a lower limit value and an upper limit value.

In the present specification, regarding the description of a group (an atomic group), in a case where whether the group is substituted or unsubstituted is not described, the group includes a group which has a substituent as well as a group which does not have a substituent. For example, an "alkyl group" includes not only an alkyl group (an unsubstituted alkyl group) which does not have a substituent but also an alkyl group (a substituted alkyl group) which has a substituent.

In addition, "actinic rays" or "radiation" in the present specification means, for example, a bright line spectrum of a mercury lamp such as a g-line, an h-line, or an i-line, far ultraviolet rays typified by an excimer laser, extreme ultraviolet rays (EUV rays), X-rays, electron beams (EB), or the like. In addition, in the present invention, light means actinic rays or radiation.

Further, unless otherwise specified, "exposure" in the present specification includes not only exposure by a mercury lamp, far ultraviolet rays typified by an excimer laser, extreme ultraviolet rays, X-rays, EUV light, or the like, but also the exposure includes drawing by particle beams such as electron beams and ion beams.

In the present specification, "(meth)acrylate" represents acrylate and methacrylate. In the present specification, "(meth)acryl" represents acryl and methacryl. In the present specification, "(meth)acryloyl" represents acryloyl and methacryloyl. In the present specification, "(meth)acrylamide" represents acrylamide and methacrylamide. In the present specification, a "monomeric substance" and a "monomer" have the same definition.

In the present specification, "ppm" means "parts per million ($10^{-6}$)", "ppb" means "parts per billion ($10^{-9}$)", and "ppt" means "parts per trillion ($10^{-12}$)".

In addition, in the present specification, a weight-average molecular weight (Mw) is a value in terms of polystyrene, as measured by a gel permeation chromatography (GPC) method.

In the present specification, the GPC method is based on a method in which HLC-8020 GPC (manufactured by TOSOH CORPORATION) is used, TSKgel SuperHZM-H, TSKgel SuperHZ4000, and TSKgel SuperHZ2000 (manufactured by TOSOH CORPORATION, 4.6 mm ID×15 cm) are used as columns, and tetrahydrofuran (THF) is used as an eluent.

A bonding direction of a divalent group (for example, —COO—) described in the present specification is not limited unless otherwise specified. For example, in a case where Y is —COO— in a compound represented by the general formula of "X—Y—Z", the compound may be "X—O—CO—Z" or "X—CO—O—Z".

In the present specification, a description that a component is black means that the component has an absorption over the entire range of a wavelength of 400 to 700 nm.

[Photosensitive Composition (Composition)]

A photosensitive composition according to an embodiment of the present invention (hereinafter, also simply referred to as a "composition") contains;
a zirconium nitride-based particle (hereinafter, also simply referred to as a "specific particle") containing one or more selected from the group consisting of zirconium nitride and zirconium oxynitride,
a resin;
a polymerizable compound; and
a photopolymerization initiator,
in which the specific particle contains 0.001% to 0.400% by mass of a Fe atom with respect to a total mass of the specific particle.

The mechanism by which the objects of the present invention are achieved with the composition having the constitution described above is not necessarily clear; however, the inventors of the present invention conceive as follows.

It is conceived that in a case where a predetermined amount or more of the Fe atom is contained in the specific particle, the specific particle easily interacts with a developer, and the specific particle hardly remains as a residue after the patterning of a cured film such as a development treatment. As a result, it is presumed that in a case where the content of the Fe atom of the specific particle is set to a predetermined amount or more, the patterning properties of the cured film are improved.

On the other hand, it is conceived that in a case where the content of the Fe atom contained in the specific particle is too large, the amount of the Fe atom remaining on the electrode and the substrate after the development increases, which causes the corrosion of the electrode. As a result, it is presumed that the electrode anticorrosion properties become excellent in a case where the content of the Fe atom in the specific particle is set to a predetermined amount or less.

Further, the composition according to the embodiment of the present invention also has the good spectral characteristics (light shielding properties), the suppressibility of the outgas containing chlorine, the temporal viscosity stability, and the adhesiveness of the cured film to the substrate.

Hereinafter, in a case where any one of the patterning properties in a case of forming a cured film, the electrode anticorrosion properties of the cured film, the spectral characteristics (the light shielding properties) of the cured film, the suppressibility of the outgas of a chlorine gas of the cured film, the temporal viscosity stability of the composition, or the adhesiveness of the cured film to the substrate is excellent, it is also said that the effect of the present invention is excellent.

It is noted that in a case where the outgas of a chlorine gas is suppressed, the contamination of the substrate derived from the chlorine gas can be suppressed, or the contamination of the heating device and/or the exposure device derived from the chlorine gas can be suppressed.

Hereinafter, components contained in the composition according to the embodiment of the present invention will be described.

[Zirconium Nitride-Based Particle (Specific Particle)]

The composition according to the embodiment of the present invention contains specific particles.

The specific particle contains one or more selected from the group consisting of zirconium nitride and zirconium oxynitride.

Further, the specific particle contains an Fe atom (an iron atom), where the content of the Fe atom is 0.001% to 0.400% by mass with respect to the total mass of the specific particle.

The specific particle is preferably used as a black pigment.

The content of the specific particle is preferably 5% to 90% by mass, more preferably 15% to 80% by mass, and still more preferably 35% to 70% by mass, with respect to the total solid content of the composition.

Further, as described later, the composition according to the embodiment of the present invention may contain a coloring agent (preferably a black pigment), and the total content of the specific particle and the coloring agent (preferably the black pigment) is preferably 5% to 90% by mass, more preferably 35% to 80% by mass, and still more preferably 50% to 70% by mass, with respect to the total solid content of the composition.

In the composition, the content of the specific particle is preferably 30% to 100% by mass, more preferably 40% to 95% by mass, and still more preferably 55% to 85% by mass, with respect to the total content of the specific particle and the coloring agent (preferably the black pigment).

In the present specification, the "solid content" of the composition refers to components forming a cured film (a light shielding film) and refers to all components except a solvent in a case where the composition contains the solvent (an organic solvent, water, or the like). Moreover, in a case where the components are components forming a cured film (a light shielding film), the components are considered to be solid contents even in a case where the components are liquid components.

The average primary particle diameter of the specific particles is not particularly limited; however, it is preferably 5 to 100 nm, more preferably 5 to 50 nm, and still more preferably 5 to 30 nm, from the viewpoint that a balance between handleability and the temporal stability of the composition is more excellent.

It is noted that the average primary particle diameter of particles in the present invention can be measured using a transmission electron microscope (TEM). As the transmission electron microscope, for example, a transmission microscope HT7700 manufactured by Hitachi High-Technologies Corporation can be used.

A maximum length (Dmax: a maximum length between two points on a contour of the particle image) and a length vertical to the maximum length (DV-max: in a case where an image is sandwiched between two straight lines parallel to the maximum length, the shortest length that vertically connects the two straight lines) of a particle image obtained using the transmission electron microscope were measured, and a geometric average value thereof $(Dmax \times DV\text{-}max)^{1/2}$ was taken as a particle diameter. Particle diameters of 100 particles were measured by this method, and an arithmetic average value thereof was taken as an average primary particle diameter of particles.

A gas-phase reaction method is usually used for manufacturing specific particles, and specific examples thereof include an electric furnace method and a thermal plasma method. Among these production methods, a thermal plasma method is preferable due to the reason that few impurities are mixed, the particle diameters are likely to be uniform, and the productivity is high.

Examples of the method of generating thermal plasma include direct-current arc discharge, multi-phase arc discharge, high frequency (RF) plasma, and hybrid plasma, where a high frequency plasma in which few impurities are mixed from an electrode is preferable.

The specific manufacturing method for specific particles by the thermal plasma method includes a method in which a powder material containing zirconium (a zirconium-containing powder) is vaporized with high frequency thermal plasma, nitrogen is introduced into the apparatus as a carrier gas, and the zirconium-containing powder is nitrided through a cooling process to synthesize specific particles. In a case where the zirconium-containing powder is vaporized by high frequency thermal plasma, a component containing the Fe atom and the like may be vaporized together as desired. It is noted that the thermal plasma method is not limited to the above method.

It is noted that the specific particles at the time when having been obtained in this way are usually specific particles consisting of only a core portion containing one or more selected from the group consisting of zirconium nitride and zirconium oxynitride. A coating layer as described later may be formed on the surface of such a core portion to form specific particles including a core portion and a coating layer that covers the core portion.

As a more specific manufacturing method for specific particles, the manufacturing method described in paragraphs 0037 to 0089 of WO2010/147098A can be referred to. The specific particles contained in the composition according to the embodiment of the present invention can be manufactured, for example, by using a component containing an Fe atom, which will be described later, instead of the Ag powder of WO2010/147098A, and as a raw material, a mixture obtained by mixing this with a powder material containing zirconium material (a zirconium-containing powder).

The zirconium-containing powder used for manufacturing specific particles preferably has high purity. The zirconium-containing powder may be a simple substance of zirconium, or a zirconium compound may be used as desired. It is also preferable to use zirconium chloride as the zirconium compound from the viewpoint that it is easy to introduce Cl atoms as described later into specific particles to be finally obtained.

Further, the zirconium-containing powder may contain a Fe atom, and such a Fe atom may be all or part of the source of the Fe atom contained in the specific particle.

One kind of zirconium-containing powder may be used alone, or two or more kinds thereof may be used.

Here, the method of incorporating an Fe atom into the zirconium-containing powder is not particularly limited, and examples thereof include a method of introducing an Fe atom at the stage of obtaining the above-described zirconium-containing powder. More specifically, the Fe atom can be attached to the surface of the zirconium-containing powder by using a reaction container composed of a material containing a Fe atom, such as stainless steel (SUS), at the time of manufacturing a zirconium-containing powder, or by using a material containing an Fe atom as the material of the press machine and the pulverizer, with which the zirconium-containing powder is pulverized.

Further, as described above, in a case where the thermal plasma method is used in the manufacturing of specific particles, it is also possible to incorporate the Fe atom into the specific particle by adding a component containing a Fe atom (a Fe powder or the like) in addition to the zirconium-containing powder as a raw material, and subjecting them to nitridation by the thermal plasma method.

It is noted that the Fe atom contained in the specific particle may be contained in any form, for example, an ion, a metal compound (including a complex compound as well), an intermetallic compound, an alloy, an oxide, a composite oxide, a nitride, an oxynitride, a sulfide, or an oxysulfide. In addition, the Fe atom contained in the specific particle may be present as an impurity at the position between the crystal lattices or may be present as an impurity at the crystal grain boundary in an amorphous state.

Further, the Fe atom contained in the specific particle may be present in the core portion, may be present in the coating layer described later, or may be present in another form.

The specific particle preferably further contains a Cl atom (a chlorine atom).

The method of incorporating a Cl atom into the specific particle is not particularly limited, and examples thereof include a method of using, as the zirconium-containing powder that is used for manufacturing specific particles, a zirconium-containing powder such as zirconium chloride, where a part or all of the zirconium-containing powder contains a Cl atom.

It is noted that the Cl atom contained in the specific particle may be contained in any form, for example, an ion or a metal compound (including a complex compound as well). In addition, the Cl atom contained in the specific particle may be present as an impurity at the position between the crystal lattices or may be present as an impurity at the crystal grain boundary in an amorphous state.

Further, the Cl atom contained in the specific particle may be present in the core portion, may be present in the coating layer described later, or may be present in another form.

The specific particle preferably includes a core portion containing one or more selected from the group consisting of zirconium nitride and zirconium oxynitride. It is noted that the specific particle may consist of only the core portion or may further contain a coating layer described later.

The content of the core portion is preferably 60% to 100% by mass, more preferably 85% to 100% by mass, and still more preferably more than 93% and less than 97% by mass, with respect to the total mass of the specific particle.

The total content of the zirconium nitride and zirconium oxynitride is preferably 90% to 100% by mass, more preferably 95% to 99.999% by mass, and still more preferably 99% to 99.99% by mass, with respect to the total mass of the core portion.

The total content of the zirconium nitride and zirconium oxynitride is preferably 60% to 100% by mass, more preferably 85% to 100% by mass, and still more preferably more than 93% and less than 97% by mass, with respect to the total mass of the specific particle.

From the viewpoint that the patterning properties of the cured film and/or the electrode anticorrosion properties are more excellent, the content of the Fe atom in the cured film is 0.001% to 0.400% by mass, more preferably 0.010% to 0.250% by mass, and still more preferably 0.010% to 0.150% by mass, with respect to the total mass of the specific particle. It is noted that in a case where the specific particle contains a coating layer described later, the coating layer portion is also included in the specific particle. That is, in a case where the total mass of the specific particle is referred to, the total mass of the specific particle means the mass of the specific particle including a coating layer portion in a case where the specific particle includes the coating layer.

The content of the Fe atom is preferably 0.001% to 0.400% by mass, more preferably 0.010% to 0.250% by mass, and still more preferably 0.010% to 0.150% by mass, with respect to the total mass of the core portion.

As described above, the specific particle preferably contains a Cl atom. In a case where the specific particle contains a Cl atom, it is conceived that the specific particle properly interacts with a developer and the patterning properties are improved.

From the viewpoint that the Cl atom content in the outgas of the cured film can be further reduced and/or the patterning properties are more excellent, the content of the Cl atom is preferably 0.001% to 0.500% by mass, more preferably 0.001% to 0.300% by mass, still more preferably 0.010% to 0.300% by mass, and particularly preferably 0.020% to 0.200% by mass, with respect to the total mass of the specific particle or core portion.

The mass ratio (the content of the Fe atom/the content of the Cl atom) of the content of the Fe atom to the content of the Cl atom in the specific particle or the core portion is preferably 0.001 to 400, more preferably 0.008 to 2.5, still more preferably 0.008 to 1.5, and particularly preferably 0.008 to 1.0.

In a case where the above mass ratio is equal to or lower than a predetermined value, it is conceived that corrosion of the electrode due to the presence of a large number of Fe atoms can be suppressed. In a case where the above mass ratio is equal to or higher than a predetermined value, it is conceived that the corrosion of the electrode which may be caused by the Cl atom is suppressed by the Fe atom.

The content of the Zr atom (the zirconium atom) is preferably 20% to 70% by mass, more preferably 30% to 60% by mass, and still more preferably 40% to 50% by mass, with respect to the total mass of the specific particle or the core portion.

The content of the N atom (the nitrogen atom) is preferably 10% to 40% by mass, more preferably 20% to 40% by mass, and still more preferably 28% to 38% by mass, with respect to the total mass of the specific particle or the core portion.

The content of the O atom (the oxygen atom) is preferably 0% to 35% by mass, more preferably 5% to 28% by mass, and still more preferably 13% to 23% by mass, with respect to the total mass of the specific particle or the core portion.

It is noted that the contents of the Zr atom, the Fe atom, and the Cl atom in the specific particle are measured by the ICP emission spectroscopic analysis method. The ICP emission spectroscopic analysis method is a method of applying plasma energy to a sample to excite elements (atoms) in the sample, and measuring the light emitted in a case where the excited elements (atoms) return to a low energy level, thereby identifying the kinds of elements (atoms) from the wavelength of the light. For the ICP emission spectroscopic analysis method, an ICP emission spectroscopic analysis apparatus "ICPE-9800" (product name) manufactured by Shimadzu Corporation can be used.

The contents of the N atom and the O atom in the specific particle are measured by the inert gas fusion-thermal conductivity method. For the inert gas fusion-thermal conductivity method, an oxygen/nitrogen analysis apparatus "EMGA-620 W/C" (product name) manufactured by HORIBA, Ltd. can be used.

<Coating Layer>

The specific particle may be a specific particle including a core portion containing one or more selected from the group consisting of zirconium nitride and zirconium oxynitride, and a coating layer that covers the core portion.

Hereinafter, the specific particle including a coating layer is also referred to as a coated particle.

The coating layer is a layer that covers the core portion.

The coating with the coating layer may be a coating of the entire surface of the core portion or may be a coating of a part of the surface thereof. That is, a part of the core portion may be exposed on the surface as long as the coating layer is arranged on a part or more of the surface of the core portion.

The presence or absence of coating can be determined using, for example, a field emission scanning transmission electron microscope with an energy dispersive X-ray spectrometer (FE-STEM/EDS).

The coating layer may be made of an organic substance, an inorganic substance, or a hybrid of an organic substance and an inorganic substance.

Examples of the coating layer which is made of an organic substance include a coating layer obtained by subjecting the core portion to a surface treatment with an epoxy resin and a silane compound containing an amino group.

Among the above, the coating layer is preferably a metal oxide coating layer consisting of a metal oxide.

The metal in the metal oxide constituting the metal oxide coating layer is not limited, and it may be a typical element metal or a transition metal. In addition, the metal may be a semimetal such as silicon.

Examples of the metal include aluminum (Al), silicon (Si), zinc (Zn), germanium (Ge), hafnium (Hf), gallium (Ga), molybdenum (Mo), titanium (Ti), zirconium (Zr), vanadium (V), tantalum (Ta), niobium (Nb), cobalt (Co), chromium (Cr), copper (Cu), manganese (Mn), ruthenium (Ru), iron (Fe), nickel (Ni), tin (Sn), and silver (Ag).

Among them, the metal is preferably aluminum (Al) or silicon (Si).

The metal oxide may be an oxide of a single metal (for example, the above-described metal), or may be a complex oxide of a plurality of metals.

Examples of the metal oxide include alumina ($Al_2O_3$), silica ($SiO_2$), ZnO, $GeO_2$, $TiO_2$, $ZrO_2$, $HfO_2$, $Sn_2O_3$, $Mn_2O_3$, $Ga_2O_3$, $Mo_2O_3$, $Ta_2O_5$, $V_2O_5$, and $Nb_2O_5$.

Among them, the metal oxide preferably contains alumina or silica.

The metal oxide may be used alone, or two or more thereof may be used. However, in a case where two or more metal oxides are used, the content of the metal oxide having the highest content is preferably 50% by mass or more and more preferably 80% by mass or more with respect to the total mass of the two or more metal oxides. The upper limit thereof is less than 100% by mass.

The expression that the metal oxide coating layer consists of a metal oxide means that the metal oxide coating layer substantially consists of only a metal oxide.

The expression that the metal oxide coating layer substantially consists of only a metal oxide means, for example, that the content of the metal oxide (preferably, one or both of alumina and silica) in the metal oxide coating layer is 90% to 100% by mass (preferably 95% to 100% by mass and more preferably 99% to 100% by mass) with respect to the total mass of the metal oxide coating layer.

Moreover, the content of the metal oxide coating layer is preferably 0.1% to 15% by mass, more preferably 1% to 10% by mass, and still more preferably 3% to 7% by mass, with respect to the total mass of the coated particle.

The content of the metal oxide coating layer can be determined using electron spectroscopy for chemical analysis (ESCA).

The manufacturing method for the coated particle is not particularly limited, and examples thereof include a method in which, in the manufacturing method for a black titanium oxynitride powder that is a powder base of black titanium oxynitride coated with a silica film described in paragraphs 0018, 0019, and 0025 of JP2015-117302A or the like, the powder base of black titanium oxynitride is replaced with the specific particle consisting of only the core portion.

Another example of the method of manufacturing the coated particle includes a method in which, in the inorganic treatment step in the surface treatment of titanium dioxide described in paragraph 0059 and the like of JP2017-014522A, a step in which the titanium dioxide is replaced with the specific particle consisting of only the core portion is carried out.

Still another example of the method of manufacturing the coated particle includes a method in which, in JP1996-059240A (JP-H08-059240A) (JP3314542B), a gas barrier thin film is formed on the surface of the above-described specific particle consisting of only the core portion instead of the particle of lower order titanium oxide.

[Coloring Agent]

The composition according to the embodiment of the present invention may further contain a coloring agent.

The coloring agent is a component different from the specific particle.

Examples of the coloring agent include a pigment and a dye.

The pigment may be an inorganic pigment or may be an organic pigment.

The content of the coloring agent is preferably 1% to 60% by mass, more preferably 5% to 40% by mass, and still more preferably 10% to 25% by mass, with respect to the total solid content of the composition.

It is preferable that a part or all of the coloring agent is a coloring agent (a black coloring agent) having a black color.

It is noted that a plurality of coloring agents, each of which cannot be used as a black coloring agent, may be combined and adjusted to be black as a whole, and may be used as a black coloring agent.

Examples of the black coloring agent include a black pigment and a black dye.

<Black Pigment>

It is also preferable that the composition of the embodiment of the present invention contains a black pigment.

The above-described zirconium nitride-based particle is not included in the black pigment.

As a black pigment, various known black pigments can be used. The black pigment may be an inorganic pigment or an organic pigment.

As the black coloring material, from the viewpoint that the light resistance of the cured film is superior, an inorganic pigment is preferable.

The black pigment is preferably a pigment which alone develops a black color, and more preferably a pigment which alone develops a black color and absorbs infrared rays.

Here, the black pigment which absorbs infrared rays has an absorption in a wavelength range of an infrared range (preferably, a wavelength of 650 to 1,300 nm). A black pigment having a maximal absorption wavelength in a wavelength range of a wavelength of 675 to 900 nm is also preferable.

A particle diameter of the black pigment is not particularly limited; however, it is preferably 5 to 100 nm, more preferably 5 to 50 nm, and still more preferably 5 to 30 nm, from the viewpoint that a balance between handleability and the temporal stability (a black pigment is not sedimented) of the composition is superior.

(Inorganic Pigment)

The inorganic pigment is not particularly limited as long as the inorganic pigment has light shielding properties and is a particle containing an inorganic compound, and known inorganic pigments can be used.

From the viewpoint that the low reflection properties and the light shielding properties of the light shielding film are superior, an inorganic pigment is preferable as the black coloring material.

Examples of the inorganic pigment include a metal oxide, a metal nitride, and a metal oxynitride which contain a metallic element of group 4 such as titanium (Ti) and zirconium (Zr), a metallic element of group 5 such as vanadium (V) and niobium (Nb), or one or more metallic elements selected from the group consisting of cobalt (Co), chromium (Cr), copper (Cu), manganese (Mn), ruthenium (Ru), iron (Fe), nickel (Ni), tin (Sn), and silver (Ag).

As the metal oxide, the metal nitride, and the metal oxynitride, particles in which other atoms are further mixed may be used. For example, metal nitride-containing particles, which further contain an atom (preferably, an oxygen atom and/or a sulfur atom) selected from elements of groups 13 to 17 of the periodic table, can be used.

The manufacturing method for the metal nitride, the metal oxide, or the metal oxynitride is not particularly limited as long as a black pigment having desired physical properties can be obtained, and a known manufacturing method such as a gas-phase reaction method can be used. Examples of the gas-phase reaction method include an electric furnace method and a thermal plasma method. However, from the viewpoint that few impurities are mixed in, particle diameters are likely to be uniform, and productivity is high, a thermal plasma method is preferable.

The surface of the metal nitride, metal oxide, or metal oxynitride may be coated. Regarding the coating, the entire surface of the particle may be coated or a part thereof may be coated. The coating is preferably coating with a silane coupling agent, silica, or alumina.

Among the above, from the viewpoint that the generation of undercut in a case of forming a light shielding film can be suppressed, nitrides or oxynitrides of one or more metals selected from the group consisting of titanium, vanadium, zirconium, and niobium are more preferable. In addition, from the viewpoint that moisture resistance of the light shielding film is more excellent, an oxynitride of one or more metals selected from the group consisting of titanium, vanadium, zirconium, and niobium is still more preferable, and titanium nitride, titanium oxynitride (titanium black), zirconium nitride, or zirconium oxynitride is particularly preferable. The above-described nitride or oxynitride of one or more metals selected from the group consisting of titanium, vanadium, zirconium, and niobium may further include an element selected from Na, Mg, K, Ka, Rb, Cs, Hf, Ta, Cr, Mo, W, Mn, Ru, Os, Co, Ni, Pd, Pt, Cu, Ag, Au, Zn, In, Cl, Br, and I. The content of the element is preferably 0.001% to 5% by mass with respect to the total mass of the nitride or oxynitride of the metal.

As the titanium black, it is possible to use, for example, the titanium black described in paragraphs 0122 to 0129 of WO2018/139186A. The same applies to the preferred range thereof.

Examples of the inorganic pigment include carbon black as well.

Examples of the carbon black include furnace black, channel black, thermal black, acetylene black, and lamp black.

As the carbon black, carbon black produced by known methods such as an oil furnace method may be used, or a commercial product may be used. Specific examples of the commercial product of the carbon black include an organic pigment such as C. I. Pigment Black 1 and an inorganic pigment such as C. I. Pigment Black 7.

As the carbon black, carbon black subjected to a surface treatment is preferable. The surface treatment can reform the particle surface state of the carbon black and improve the dispersion stability in the composition. Examples of the surface treatment include a coating treatment with a resin, a surface treatment for introducing an acidic group, and a surface treatment with a silane coupling agent.

As the carbon black, carbon black subjected to a coating treatment with a resin is preferable. The light shielding properties and the insulating properties of the light shielding film can be improved by coating the particle surface of carbon black with an insulating resin. In addition, the reliability or the like of the image display device can be improved by reducing the leakage current or the like. As a result, the above-described carbon black is suitable for a case where a light shielding film is used in use applications which require insulating properties.

Examples of the coating resin include an epoxy resin, polyamide, polyamide imide, a novolak resin, a phenol resin, a urea resin, a melamine resin, polyurethane, a diallyl phthalate resin, an alkylbenzene resin, polystyrene, polycarbonate, polybutylene terephthalate, and modified polyphenylene oxide.

From the viewpoint that the light shielding properties and the insulating properties of the light shielding film are superior, the content of the coating resin is preferably 0.1% to 40% by mass and more preferably 0.5% to 30% by mass, with respect to the total of the carbon black and the coating resin.

(Organic Pigment)

The organic pigment is not particularly limited as long as the organic pigment has light shielding properties and is a particle containing an organic compound, and known organic pigments can be used.

In the present invention, examples of the organic pigment include a bisbenzofuranone compound, an azomethine compound, a perylene compound, and an azo-based compound, where a bisbenzofuranone compound or a perylene compound is preferable.

Examples of the bisbenzofuranone compound include the compounds described in JP2010-534726A, JP2012-515233A, and JP2012-515234A. The bisbenzofuranone compound is available as "Irgaphor Black" (product name) manufactured by BASF SE.

Examples of the perylene compound include the compounds described in JP1987-1753A (JP-S62-1753A) and JP1988-26784B (JP-S63-26784B). The perylene compound is available as C. I. Pigment Black 21, 30, 31, 32, 33, and 34.

<Black Dye>

As a black dye, a dye which alone develops a black color can be used, and, for example, a pyrazole azo compound, a pyrromethene compound, an anilino azo compound, a triphenylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, and the like can be used.

In addition, regarding the black dye, reference can be made to, for example, the compounds described in JP1989-90403A (JP-S64-90403A), JP1989-91102A (JP-S64-91102A), JP1989-94301A (JP-H1-94301A), JP1994-11614A (JP-116-11614A), JP2592207B, U.S. Pat. Nos. 4,808,501A, 5,667,920A, 505,950A, 5,667,920A, JP1993-333207A (JP-H5-333207A), JP1994-35183A (JP-H6-35183A), JP1994-51115A (JP-H6-51115A), JP1994-194828A (JP-H6-194828A), and the like, the contents of which are incorporated into the present specification.

Specific examples of these black dyes include dyes specified by Color Index (C. I.) of SOLVENT BLACK 27 to 47, and a dye specified by C. I. of SOLVENT BLACK 27, 29, or 34 is preferable.

Furthermore, examples of commercial products of these black dyes include dyes such as SPILON Black MH and Black BH (both produced by Hodogaya Chemical Co., Ltd.), VALIFAST Black 3804, 3810, 3820, and 3830 (all produced by Orient Chemical Industries Co., Ltd.), Savinyl Black RLSN (produced by Clariant), and KAYASET Black K-R and K-BL (both produced by Nippon Kayaku Co., Ltd.).

In addition, a dye multimer may be used as the black dye. Examples of the dye multimer include the compounds described in JP2011-213925A and JP2013-041097A. Moreover, a polymerizable dye having polymerizability in a molecule may be used, and examples of a commercial product thereof include RDW series produced by FUJIFILM Wako Pure Chemical Corporation.

Furthermore, as described above, a combination of a plurality of dyes, each of which has a color other than the black color, may be used as a black dye. As such a coloring dye, for example, the dye described in paragraphs 0027 to 0200 of JP2014-42375A can also be used in addition to a dye (chromatic dye) having a chromatic color such as red (R), green (G), and blue (B).

[Resin]

The composition according to the embodiment of the present invention contains a resin.

Moreover, the molecular weight of the resin is more than 3,000. In a case where the molecular weight of the resin is polydisperse, the weight-average molecular weight thereof is more than 3,000.

The content of the resin in the composition is preferably 3% to 60% by mass, more preferably 7% to 40% by mass, and still more preferably 15% to 35% by mass, with respect to the total solid content of the composition.

In a case where two or more resins are used in combination, the total content thereof is preferably within the above range.

The resin also preferably contains an acid group (for example, a carboxyl group, a sulfo group, a monosulfate ester group, $-OPO(OH)_2$, a monophosphate ester group, a borate group, and/or a phenolic hydroxyl group).

The resin also preferably contains a curable group. Examples of the curable group include an ethylenic unsaturated group (for example, a (meth)acryloyl group, a vinyl group, or a styryl group), and a cyclic ether group (for example, an epoxy group or an oxetanyl group).

The resin according to the embodiment of the present invention may be any one of a dispersing agent, an alkali-soluble resin, or the like.

<Dispersing Agent>

The dispersing agent is, for example, a resin that is capable of suppressing the aggregation and/or sedimentation of a component present in a solid state in the composition, such as a pigment.

The content of the dispersing agent is preferably 3% to 60% by mass, more preferably 7% to 40% by mass, and still more preferably 13% to 25% by mass, with respect to the total solid content of the composition.

The dispersing agent preferably contains an acid group.

The dispersing agent also preferably contains a curable group.

Examples of the dispersing agent include a resin containing a structural unit containing a graft chain and/or a resin containing a radial structure.

Examples of the structural unit containing a graft chain, in the resin containing the structural unit containing a graft chain include a structural unit represented by any one of Formulae (1) to (4).

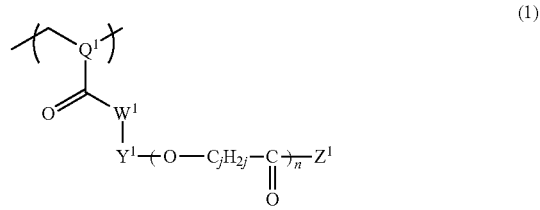

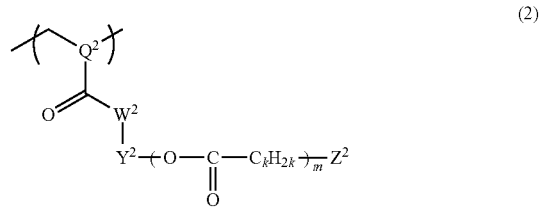

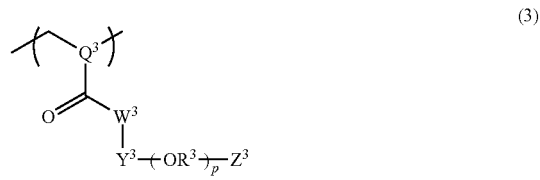

(4)

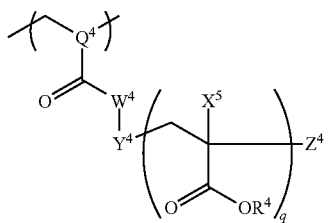

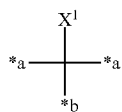
(QX1)

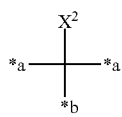
(QX2)

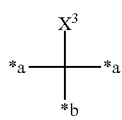
(QX3)

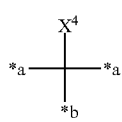
(QX4)

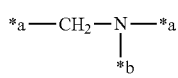
(QNA)

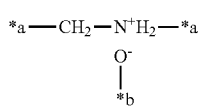
(QNB)

represents a bonding position to a group on a side opposite to any one of $W^1$ to $W^4$, to which A is bonded.

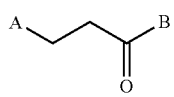 (Y-1)

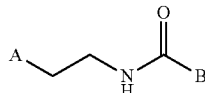 (Y-2)

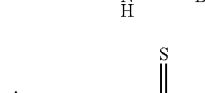 (Y-3)

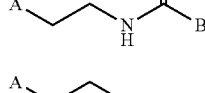 (Y-4)

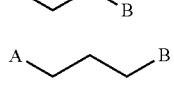 (Y-5)

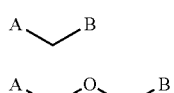 (Y-6)

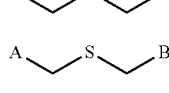 (Y-7)

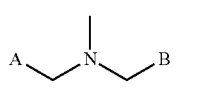 (Y-8)

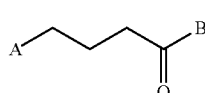 (Y-9)

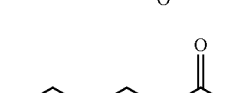 (Y-10)

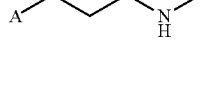 (Y-11)

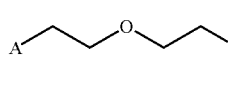 (Y-12)

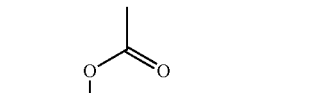 (Y-13)

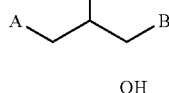 (Y-14)

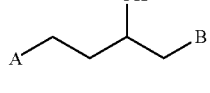 (Y-15)

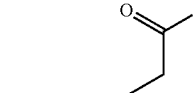

In Formulae (1) to (4), $Q^1$ is a group represented by any one of Formulae (QX1), (QNA), and (QNB), $Q^2$ is a group represented by any one of Formulae (QX2), (QNA), and (QNB), $Q^3$ is a group represented by any one of Formulae (QX3), (QNA), and (QNB), and $Q^4$ is a group expressed by any one of Formulae (QX4), (QNA), and (QNB).

In Formulae (QX1) to (QX4), (QNA), and (QNB), *a represents a bonding position on the main chain side, and *b represents a bonding position on the side chain side.

In Formulae (1) to (4), $W^1$, $W^2$, $W^3$, and $W^4$ each independently represent a single bond, an oxygen atom, or NH.

In Formulae (1) to (4) and (QX1) to (QX4), $X^1$, $X^2$, $X^3$, $X^4$, and $X^5$ each independently represent a hydrogen atom or a monovalent organic group. From the viewpoint of the restriction on synthesis, $X^1$, $X^2$, $X^3$, $X^4$, and $X^5$ are preferably each independently a hydrogen atom or an alkyl group having 1 to 12 carbon atoms (the number of carbon atoms), more preferably each independently a hydrogen atom or a methyl group, and still more preferably each a methyl group.

In Formulae (1) to (4), $Y^1$, $Y^2$, $Y^3$, and $Y^4$ each independently represent a single bond or a divalent linking group, and the linking group is not particularly limited regarding the structure. Specific examples of the divalent linking groups represented by $Y^1$, $Y^2$, $Y^3$, and $Y^4$ include linking groups represented by the following (Y-1) to (Y-23).

In the linking group shown below, A represents a bonding position to any one of $W^1$ to $W^4$ in Formulae (1) to (4). B -continued

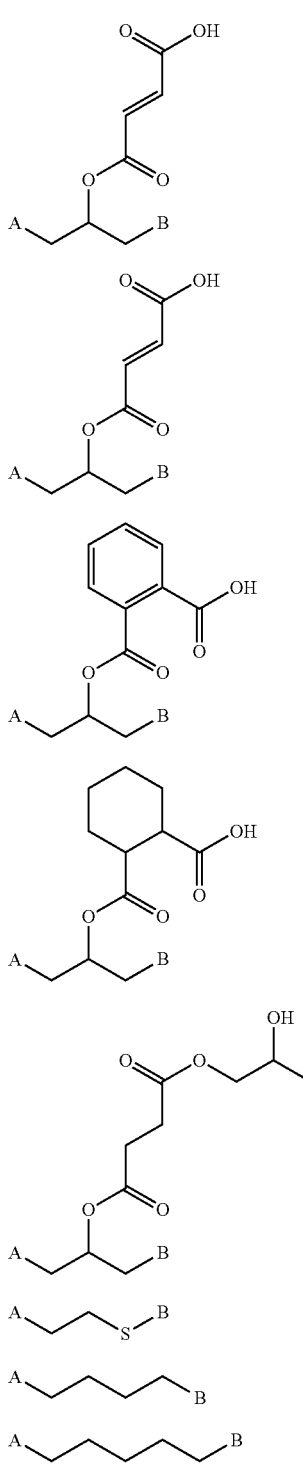

(Y-16)
(Y-17)
(Y-18)
(Y-19)
(Y-20)
(Y-21)
(Y-22)
(Y-23)

In Formulae (1) to (4), $Z^1$, $Z^2$, $Z^3$, and $Z^4$ each independently represent a monovalent substituent. The structure of the substituent is not particularly limited; however, specific examples thereof include an alkyl group, a hydroxyl group, an alkoxy group, an aryloxy group, a heteroaryloxy group, an alkylthio group, an arylthio group, a heteroarylthio group, and an amino group.

Among them, particularly from the viewpoint of improvement in the dispersibility, the substituents represented by $Z^1$, $Z^2$, $Z^3$, and $Z^4$ are each independently preferably a group that exhibits a steric repulsion effect, and each independently more preferably an alkyl group or alkoxy group having 5 to 24 carbon atoms, and, among them, in particular, each independently still more preferably a branched alkyl group having 5 to 24 carbon atoms, a cyclic alkyl group having 5 to 24 carbon atoms, or an alkoxy group having 5 to 24 carbon atoms. It is noted that the alkyl group contained in the alkoxy group may be either linear, branched, or cyclic.

In addition, it is also preferable that the substituents represented by $Z^1$, $Z^2$, $Z^3$, and $Z^4$ are each a group containing a curable group such as a (meth)acryloyl group. Examples of the group containing a curable group include an "—O-alkylene group-(—O-alkylene group-)$_{AL}$-(meth)acryloyloxy group". AL represents an integer of 0 to 5 and is preferably 1. The alkylene groups each independently preferably have 1 to 10 carbon atoms. In a case where the alkylene group has a substituent, the substituent is preferably a hydroxyl group.

The substituent may be a group containing an onium structure.

The group containing an onium structure is a group having an anionic moiety and a cationic moiety. Examples of the anionic moiety include a partial structure containing an oxygen anion (—O$^-$). Among them, the oxygen anion (—O$^-$) is preferably directly bonded to a terminal of a repeating structure attached with n, m, p, or q in the repeating units represented by Formulae (1) to (4), and more preferably directly bonded to a terminal (that is, a right end in —(—O—$C_jH_{2j}$—CO—)$_n$—) of a repeating structure attached with n in the repeating unit represented by Formula (1).

Examples of the cation of the cationic moiety of the group containing an onium structure include an ammonium cation. In a case where the cationic moiety is the ammonium cation, the cationic moiety is a partial structure containing the cationic nitrogen atom (>N$^+$<). The cationic nitrogen atom (>N$^+$<) is preferably bonded to four substituents (preferably, organic groups), and it is preferable that one to four among the substituents are each an alkyl group having 1 to 15 carbon atoms. In addition, it is also preferable that one or more (preferably, one) among the four substituents are each a group containing a curable group. Examples of the group containing a curable group, which can serve as a substituent, include the above-described "—O-alkylene group-(—O-alkylene group-)$_{AL}$-(meth)acryloyloxy group".

In Formulae (1) to (4), n, m, p, and q are each independently an integer of 1 to 500, preferably an integer of 2 to 500, and more preferably an integer of 6 to 500.

In Formula (3), $R^3$ represents a branched or linear alkylene group, is preferably an alkylene group having 1 to 10 carbon atoms, and is more preferably an alkylene group having 2 or 3 carbon atoms.

In Formula (4), $R^4$ represents a hydrogen atom or a monovalent organic group, and the structure of the monovalent organic group is not particularly limited. $R^4$ is preferably a hydrogen atom, an alkyl group, an aryl group, or a heteroaryl group, and more preferably a hydrogen atom or an alkyl group. In a case where $R^4$ is an alkyl group, the alkyl group is preferably a linear alkyl group having 1 to 20 carbon atoms, a branched alkyl group having 3 to 20 carbon atoms, or a cyclic alkyl group having 5 to 20 carbon atoms.

In the resin containing a structural unit containing a graft chain, the total content of the structural unit represented by any one of Formulae (1) to (4) is preferably 2% to 100 and more preferably 6% to 100% by mass with respect to the total mass of the resin.

The resin containing a radial structure is preferably, for example, a compound represented by General Formula (X-2).

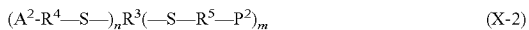

$$(A^2\text{-}R^4\text{—S—})_n R^3 (\text{—S—}R^5\text{—}P^2)_m \qquad (X\text{-}2)$$

In General Formula (X-2), $A^2$ represents a monovalent organic group containing at least one moiety selected from an organic dye structure, a heterocyclic structure, an acid group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group. n pieces of $A^1$ may be the same or different from each other.

In General Formula (X-2), $R^4$ and $R^5$ each independently represent a single bond or a divalent organic linking group.

Examples of the divalent organic linking group include a group containing 1 to 10 carbon atoms, 0 to 100 nitrogen atoms, 0 to 50 oxygen atoms, 1 to 200 hydrogen atoms, and 0 to 20 sulfur atoms. The divalent organic linking group is preferably an alkylene group which may contain a substituent. The alkylene group preferably has 2 to 5 carbon atoms. The substituent that is capable of being contained in the alkylene group is preferably an acid group.

n pieces of $R^4$ may be the same or different from each other. In addition, m pieces of $R^5$ may be the same or different from each other.

In General Formula (X-2), $R^3$ represents an (m+n)-valent organic linking group. m+n is preferably 3 to 10.

Examples of the (m+n)-valent organic linking group represented by $R^3$ include a group containing 1 to 60 carbon atoms, 0 to 10 nitrogen atoms, 0 to 50 oxygen atoms, 1 to 100 hydrogen atoms, and 0 to 20 sulfur atoms.

In General Formula (X-2), m represents an integer of 1 to 8.

Further, in General Formula (X-2), n represents an integer of 2 to 9.

Further, $P^2$ in General Formula (X-2) represents a polymer skeleton, and it can be selected from known polymers and the like according to the purpose. m pieces of $P^2$ may be the same or different from each other. The polymer skeleton is preferably a polymer skeleton consisting of at least one selected from the group consisting of a polymer or copolymer of a vinyl monomer, an ester-based polymer, an ether-based polymer, a urethane-based polymer, an amide-based polymer, an epoxy-based polymer, a silicone-based polymer, or a modified product or copolymer thereof, [for example, a polyether/polyurethane copolymer or a copolymer of a polymer of polyether/a vinyl monomer (any one of a random copolymer, a block copolymer, or a graft copolymer may be good) is included].

Among the above, the polymer skeleton is preferably a polymer skeleton consisting of a polymer or copolymer of a vinyl monomer, and it is more preferably a polymer skeleton consisting of a polymer or a copolymer of (meth)acrylic acid and/or (meth)acrylic acid esters.

As the dispersing agent, it is also possible to use, for example, the polymer compounds described in paragraphs 0071 to 0141 of WO2019/069690A.

<Alkali-Soluble Resin>

The alkali-soluble resin is, for example, a resin that is capable of exhibiting solubility in a basic solution such as a basic aqueous solution.

The alkali-soluble resin is preferably a resin different from the above-described dispersing agent.

The content of the alkali-soluble resin is preferably 0.1% to 30% by mass, more preferably 0.5% to 25% by mass, and still more preferably 1% to 10% by mass, with respect to the total solid content of the composition.

The alkali-soluble resin preferably contains an acid group as an alkali-soluble group for achieving alkali solubility.

The alkali-soluble resin also preferably contains a curable group. The alkali-soluble resin also preferably contains a structural unit containing a curable group. The content of the structural unit containing a curable group is preferably 5% to 60% by mole, more preferably 10% to 45% by mole, and still more preferably 15% to 35% by mole, with respect to all the structural units of the alkali-soluble resin.

As the alkali-soluble resin, a copolymer of [benzyl (meth)acrylate/(meth)acrylic acid/another addition polymerizable vinyl monomer, as needed], and a copolymer of [allyl(meth)acrylate/(meth)acrylic acid/another addition polymerizable vinyl monomer, as needed] are suitable because the copolymers have an excellent balance among film hardness, sensitivity, and developability.

The other addition polymerizable vinyl monomer may be one kind or two or more kinds.

The copolymer preferably has a curable group and more preferably contains an ethylenically unsaturated group such as a (meth)acryloyl group, from the viewpoint that the moisture resistance of the light shielding film is more excellent.

For example, a curable group may be introduced into a copolymer by using a monomer having the curable group as the other addition polymerizable vinyl monomer. In addition, a curable group (preferably, an ethylenically unsaturated group such as (meth)acryloyl group) may be introduced into a part or all of one or more units derived from (meth)acrylic acid and/or units derived from the other addition polymerizable vinyl monomer in the copolymer.

As the alkali-soluble resin, it is possible to use, for example, the resins described in paragraphs 0143 to 0163 of WO2019/069690A.

The weight-average molecular weights of the dispersing agent and the resin such as the alkali-soluble resin are each independently preferably more than 3,000 and 100,000 or less, and more preferably more than 3,000 and 50,000 or less.

The acid values of the dispersing agent and the resin such as the alkali-soluble resin are each independently preferably 10 to 300 mgKOH/g and more preferably 30 to 200 mgKOH/g.

The amine values of the dispersing agent and the resin such as the alkali-soluble resin are each independently preferably 0 to 100 mgKOH/g and more preferably 0 to 25 mgKOH/g.

[Polymerizable Compound]

The composition according to the embodiment of the present invention contains a polymerizable compound.

In the present specification, the polymerizable compound is a compound that is polymerized by the action of the photopolymerization initiator which will be described later, and it is a component different from the dispersing agent and the resin such as the alkali-soluble resin.

The polymerizable compound is preferably a low-molecular-weight compound. The low-molecular-weight compound referred to here is preferably a compound having a molecular weight of 3,000 or less.

The content of the polymerizable compound in the composition is not particularly limited; however, it is preferably 1% to 35% by mass, more preferably 4% to 25% by mass, and still more preferably 8% to 20% by mass, with respect to the total solid content of the composition. One kind of polymerizable compound may be used alone, or two or more kinds thereof may be used. In a case where two or more polymerizable compounds are used, the total content thereof is preferably within the above range.

The polymerizable compound is preferably a compound containing an ethylenically unsaturated group.

That is, the composition according to the embodiment of the present invention preferably contains, as a polymerizable compound, a low-molecular-weight compound containing an ethylenically unsaturated group.

The polymerizable compound is preferably a compound containing one or more ethylenically unsaturated bonds such as a (meth)acryloyl group), more preferably a compound containing two or more ethylenically unsaturated bonds, still more preferably a compound containing three or more ethylenically unsaturated bonds, and particularly preferably a compound containing five or more ethylenically unsaturated bonds. The upper limit is, for example, 15 ethylenically unsaturated bonds or less.

The polymerizable compound is preferably a compound represented by Formula (Z-6).

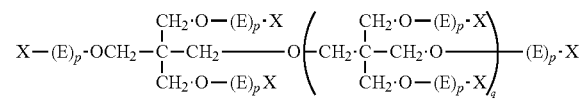

(Z-6)

In Formula (Z-6), E's each independently represent $-(CH_2)_y-CH_2-O-$, $-(CH_2)_y-CH(CH_3)-O-$, $-(CH_2)_y-CH_2-CO-O-$, $-(CH_2)_y-CH(CH_3)-CO-O-$, $-CO-(CH_2)_y-CH_2-O-$, $-CO-(CH_2)_y-CH(CH_3)-O-$, $-CO-(CH_2)_y-CH_2-CO-O-$, or $-CO-(CH_2)_y-CH(CH_3)-CO-O-$. In these groups, the bonding position on the right side is preferably a bonding position on the X side.

y's each independently represent an integer of 1 to 10.

X's each independently represent a (meth)acryloyl group or a hydrogen atom.

p's each independently represent an integer of 0 to 10.

q represents an integer 0 to 3.

In Formula (Z-6), the total number of (meth)acryloyl groups is preferably (3+2q) or (4+2q).

p is preferably an integer of 0 to 6 and more preferably an integer of 0 to 4.

The total of each p is preferably 0 to (40+20q), more preferably 0 to (16+8q), and still more preferably 0 to (12+6q).

The compound represented by Formula (Z-6) may be used alone, or two or more kinds thereof may be used.

As the polymerizable compound, it is also possible to use, for example, the compounds described in paragraph 0050 of JP2008-260927A, paragraph 0040 of JP2015-068893A, paragraph 0227 of JP2013-029760A, and paragraphs 0254 to 0257 of JP2008-292970A.

[Photopolymerization Initiator]

The composition contains a photopolymerization initiator.

The photopolymerization initiator is not particularly limited as long as the photopolymerization initiator can initiate the polymerization of the polymerizable compound, and a known photopolymerization initiator can be used. The photopolymerization initiator is preferable, for example, a photopolymerization initiator having photosensitivity to light in the range from an ultraviolet region to a visible light region. The photopolymerization initiator may be a photoradical polymerization initiator, may be an initiator which generates active radicals by causing a certain action with a photoexcited sensitizing agent, or an initiator which initiates cationic polymerization according to the type of the polymerizable compound.

In addition, the photopolymerization initiator is preferably a compound having a molar absorption coefficient of at least 50 ($1 \cdot mol^{-1} \cdot cm^{-1}$) within a range of 300 to 800 nm (more preferably 330 to 500 nm).

The content of the photopolymerization initiator in the composition is preferably 0.5% to 20% by mass, more preferably 1.0% to 10% by mass, and still more preferably 1.5% to 8% by mass, with respect to the total solid content of the composition.

One kind of photopolymerization initiator may be used alone, or two or more kinds thereof may be used in combination. In a case where two or more photopolymerization initiators are used in combination, the total content thereof is preferably within the above range.

Examples of the photopolymerization initiator include a halogenated hydrocarbon derivative (for example, a compound having a triazine skeleton, a compound having an oxadiazole skeleton, or the like), an acyl phosphine compound such as acyl phosphine oxide, hexaaryl biimidazole, an oxime compound such as an oxime derivative, an organic peroxide, a thio compound, a ketone compound, an aromatic onium salt, an aminoacetophenone compound, and hydroxyacetophenone.

Among them, an oxime-based photopolymerization initiator which is an oxime compound is preferable.

As the photopolymerization initiator, it is also possible to use the photopolymerization initiators described in paragraphs 0164 to 0186 of WO2019/069609A. Further, it is also possible to use the peroxycinnamate derivative described in JP2019-167313A.

[Polymerization Inhibitor]

The composition may contain a polymerization inhibitor.

As the polymerization inhibitor, for example, known polymerization inhibitors can be used. Examples of the polymerization inhibitor include a phenolic polymerization inhibitor (for example, p-methoxyphenol, 2,5-di-tert-butyl-4-methylphenol, 2,6-di-tert-butyl-4-methylphenol, 4,4'-thiobis(3-methyl-6-t-butylphenol), 2,2'-methylenebis(4-methyl-6-t-butylphenol), 4-methoxynaphthol, and the like); a hydroquinone-based polymerization inhibitor (for example, hydroquinone, 2,6-di-tert-butylhydroquinone, and the like); a quinone-based polymerization inhibitor (for example, benzoquinone and the like); a free radical-based polymerization inhibitor (for example, 2,2,6,6-tetramethylpiperidine 1-oxyl free radical, 4-hydroxy-2,2,6,6-tetramethylpiperidine 1-oxyl free radicals, and the like); a nitrobenzene-based polymerization inhibitor (for example, nitrobenzene, 4-nitrotoluene, and the like); and a phenothiazine-based polymerization inhibitor (for example, phenothiazine, 2-methoxyphenothiazine, and the like).

Among them, from the viewpoint that the composition has a superior effect, a phenolic polymerization inhibitor or a free radical-based polymerization inhibitor is preferable.

In a case where the polymerization inhibitor is used together with a resin containing a curable group, the effect thereof is remarkable.

The content of the polymerization inhibitor in the composition is preferably 0.0001% to 0.5% by mass, more preferably 0.001% to 0.2% by mass, and still more preferably 0.008% to 0.05% by mass, with respect to the total solid content of the composition. One kind of polymerization inhibitor may be used alone, or two or more kinds thereof may be used in combination. In a case where two or more polymerization inhibitors are used in combination, the total content thereof is preferably within the above range.

Furthermore, a ratio (content of polymerization inhibitor/content of polymerizable compound (mass ratio)) of the content of the polymerization inhibitor to the content of the polymerizable compound in the composition is preferably 0.00005 to 0.02 and more preferably 0.0001 to 0.005.

[Surfactant]

The composition may contain a surfactant. The surfactant contributes to the improvement in the coatability of the composition.

In a case where the composition contains a surfactant, the content of the surfactant is preferably 0.001% to 2.0% by mass, more preferably 0.003% to 0.5% by mass, and still more preferably 0.005% to 0.1% by mass, with respect to the total solid content of the composition.

The surfactant may be used alone or in a combination of two or more thereof. In a case where two or more surfactants are used in combination, the total amount thereof is preferably within the above range.

Examples of the surfactant include a fluorine-based surfactant, a nonionic surfactant, a cationic surfactant, an anionic surfactant, and a silicone-based surfactant.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781F (all produced by DIC Corporation); FLUORAD FC430, FLUORAD FC431, and FLUORAD FC171 (all produced by Sumitomo 3M Limited); SURFLON S-382, SURFLON SC-101, SURFLON SC-103, SURFLON SC-104, SURFLON SC-105, SURFLON SC 1068, SURFLON SC-381, SURFLON SC-383, SURFLON S 393, and SURFLON KH-40 (all produced by ASAHI GLASS CO., LTD.); and PF636, PF656, PF6320, PF6520, and PF7002 (produced by OMNOVA Solutions Inc.).

As the fluorine-based surfactant, a block polymer can also be used, and specific examples thereof include the compound described in JP2011-89090A.

[Solvent]

The composition preferably contains a solvent.

As the solvent, for example, known solvents can be used.

The content of the solvent in the composition is preferably an amount such that the concentration of solid contents of the composition is 10% to 90% by mass, more preferably an amount such that the solid content is 10% to 45% by mass, and still more preferably an amount such that the solid content is 20% to 40% by mass.

One kind of solvent may be used alone, or two or more kinds thereof may be used in combination. In a case where two or more solvents are used in combination, the content thereof is preferably adjusted so that the total solid content of the composition is within the above range.

Examples of the solvent include water and an organic solvent.

<Organic Solvent>

Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, butyl acetate, methyl lactate, N-methyl-2-pyrrolidone, and ethyl lactate, but the present invention is not limited to these examples.

[Silica-Based Particle]

The composition may contain silica-based particles (particles containing silicon dioxide as a main component).

The content of the silica-based particle is preferably 0.1% to 70% by mass, more preferably 0.2% to 65% by mass, and still more preferably 0.3% to 60% by mass, with respect to the total solid content of the composition, from the viewpoint that the effect of the present invention is more excellent.

The silica-based particle is a material different from the above-described black pigment. That is, even in a case where the silica-based particle is black, it is not included in the black pigment.

In a case where the composition contains silica-based particles, it is conceived that the silica-based particles are likely to be unevenly distributed on the surface of the cured film (the light shielding film) formed from the composition, and the proper unevenness can be formed on the surface of the cured film (the light shielding film), and thus the reflection properties of the cured film (the light shielding film) can be suppressed.

In addition, the silica-based particle may be a particle of silica itself (a silica particle) or may be a modified silica particle including this silica particle and a coating layer that covers the surface of the silica particle.

From the viewpoint that the balance between the low reflection properties and the light shielding properties of the cured film to be obtained (particularly, the light shielding film) is excellent, the average primary particle diameter of the silica-based particles is preferably 1 to 250 nm, more preferably 5 to 200 nm, and still more preferably 10 to 150 nm. Further, in a case where the average primary particle diameter of the silica-based particles is within the above range, the low reflection properties are more excellent.

It is noted that the average primary particle diameter of the silica-based particles can be measured by the same method as the average primary particle diameter of the specific particles.

The refractive index of the silica-based particle is not particularly limited; however, it is preferably 1.10 to 1.60 and more preferably 1.15 to 1.55 from the viewpoint that the low reflection properties of the cured film are superior.

In addition, the silica particle in the silica-based particle may be a hollow particle or a solid particle.

The hollow particle refers to a particle in which a cavity is present inside the particle. The hollow particle may have a structure in which the particle consists of an inner cavity and an outer shell surrounding the cavity. In addition, the hollow particle may have a structure in which a plurality of cavities are present inside the particle.

The solid particle refers to a particle in which a cavity is substantially not present in the inside of the particle.

It is conceived that since the hollow particles have a cavity inside, and have a lower specific gravity compared to particles having no hollow structure, the hollow particles float on the surface of the coating film formed from the composition, and thus the effect of being unevenly distributed on the surface of the cured film is further enhanced.

In addition, in the hollow particle, the particle itself has a low refractive index as compared with a particle having no hollow structure. For example, in a case where the hollow particle is formed of silica, the hollow silica particle has air having a low refractive index (refractive index=1.0), and thus the refractive index of the particle itself is 1.2 to 1.4, which is significantly low as compared with normal silica (refractive index=1.6). As a result, it is conceived that in a case where the cured film is formed by using the composition containing the hollow particles, the hollow particles having a low refractive index are unevenly distributed on the surface of the cured film, an anti-reflection (AR)-type low-reflection effect is achieved, and thus the low reflection properties of the cured film are improved.

Examples of the hollow particles include the hollow silica particle described in JP2001-233611A and JP3272111B.

As the hollow particle, for example, THRULYA 4110 (product name, manufactured by JGC Catalysts and Chemicals Ltd.) can also be used.

As the solid particle, IPA-ST, IPA-ST-L, IPA-ST-ZL, MIBK-ST, MIBK-ST-L, CHO-ST-M, PGM-AC-2140Y, PGM-AC-4130Y (all of them are product names, manufactured by Nissan Chemical Corporation), or the like can be used as a preferred aspect.

As the silica particle, rosary-shaped silica particle which are a particle aggregate in which a plurality of silica particle are connected in a chain shape may be used. As the rosary-shaped silica particles, particles in which a plurality of spherical colloidal silica particle having a particle diameter of 5 to 50 nm are bonded to each other by metal oxide-containing silica are preferable.

Examples of the rosary-like colloidal silica particle include the silica sols described in JP4328935B and JP2013-253145A.

The modified silica particle is obtained by reacting an unmodified silica particle with a compound having an alkoxysilyl group. Alternatively, a modified silica particle obtained by reacting a modified silica particle precursor described later with a compound B described later is preferable.

The modified silica particle precursor is a particle obtained by subjecting an unmodified silica particle (a silica particle which has not been subjected to a surface treatment with a compound A) to a surface treatment with the compound A. In a case where the silica particle in the modified silica particle is a solid particle, the modified silica particle precursor is also a solid particle, and in a case where the silica particle in the modified silica particle is a hollow particle, the modified silica particle precursor is also a hollow particle.

The compound A is a compound represented by Formula A. The compound A is used as a so-called silane coupling agent.

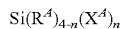
$$Si(R^A)_{4-n}(X^A)_n \quad \quad \text{Formula A}$$

$R^A$ represents a monovalent organic group containing a reactive group.

Examples of the monovalent organic group containing a reactive group include an alkyl group substituted with a reactive group and an aryl group substituted with a reactive group.

The alkyl group preferably has 1 to 30 carbon atoms, more preferably 2 to 20 carbon atoms, and still more preferably 2 to 10 carbon atoms. The alkyl group may be any structure of a linear, branched, or cyclic structure. The methylene group in the alkyl group may be substituted with —O— or —NHC(O)—.

The aryl group preferably has 6 to 30 carbon atoms, more preferably 6 to 20 carbon atoms, and still more preferably 6 to 15 carbon atoms. The awl group may be monocyclic or may have a fused-ring structure of two or more rings.

It is noted that in a case where a substituent (a reactive group) is contained, the number of carbon atoms of the substituent is not included in the number of carbon atoms of the alkyl group and the awl group.

Examples of the reactive group include an ethylenically unsaturated group, a thiol group, an epoxy group, an amino group, and an ethynyl group, and where an ethylenically unsaturated group, a thiol group, an epoxy group, or an amino group is preferable from the viewpoint that the effect of the present invention is more excellent.

Examples of the ethylenically unsaturated group include a (meth)acryloyl group and a vinyl group.

$X^A$ represents a hydroxyl group or a monovalent hydrolyzable group, and a monovalent hydrolyzable group is preferable.

Examples of the hydrolyzable group include an alkoxy group, an allyloxy group, and a halogen atom, and from the viewpoint that the effect of the present invention is more excellent, an alkoxy group or a halogen atom is preferable, and an alkoxy group is more preferable. The alkoxy group is preferably an alkoxy group having 1 to 4 carbon atoms and more preferably an alkoxy group having 1 or 2 carbon atoms. The allyloxy group is preferably an allyloxy group having 6 to 10 carbon atoms. The halogen atom is preferably a chlorine atom.

n represents an integer of 1 to 3, and it is preferably 2 or 3 from the viewpoint that the effect of the present invention is more excellent. In a case where n is 2 or less, a plurality of $R^A$'s may be the same or different from each other, and in a case where n is 2 or more, a plurality of $X^A$'s may be the same or different from each other.

The modified silica particle precursor is obtained by subjecting a silica particle (an unmodified silica particle) to a surface treatment with the compound A.

The surface treatment method is not particularly limited; however, examples thereof include a method of bringing the compound A into contact with unmodified silica particle in the presence of water. In this case, a layer (hereinafter, also referred to as a "coating layer A") obtained by a dehydration condensation reaction of a hydroxyl group derived from XA of the compound A and a hydroxyl group derived from silicon dioxide constituting the unmodified silica particle is formed on the surface of the modified silica particle precursor, and the coating layer A has $R^A$ derived from compound A. In other words, it can be said that the modified silica particle precursor has a particle containing silica (a silica particle) and a coating layer A formed on the surface of the particle containing silica. The proportion of the unmodified silica surface subjected to a surface treatment with the compound A, in the modified silica particle precursor is preferably 10% or more, more preferably 25% or more, and still more preferably 50% or more of the unmodified silica surface.

The modified silica particle is obtained by reacting a reactive group of the modified silica particle precursor with a functional group in a compound B having a functional group and an organic group which reacts with the reactive group to form a bond. The reaction rate between the reactive group of the modified silica particle precursor and the compound B is preferably 30% or more, more preferably 40% or more, and still more preferably 50% or more.

Examples of the functional group of the compound B include an amino group, a hydroxyl group, a carboxy group, a chlorine atom, a chlorocarbonyl group, an epoxy group, an isocyanate group, a (meth)acryloyl group, a sulfo group, a vinyl group, an azido group ($-N_3$), and a thiol group. Among them, an amino group, a carboxy group, an epoxy group, a (meth)acryloyl group, or a thiol group is preferable from the viewpoint that the reactivity with the reactive group of the modified silica particle precursor is excellent.

Examples of the organic group include a monovalent organic group, where an alkyl group or an aryl group is preferable. The alkyl group and the aryl group may be substituted with a substituent.

The alkyl group preferably has 1 to 30 carbon atoms and more preferably has 1 to 25 carbon atoms. The alkyl group may be any structure of a linear, branched, or cyclic structure.

The aryl group preferably has 6 to 30 carbon atoms, more preferably 6 to 20 carbon atoms, and still more preferably 6 to 15 carbon atoms. The aryl group may be monocyclic or may have a fused-ring structure of two or more rings.

In a case where the alkyl group or the aryl group is substituted, examples of the substituents include a fluorine atom, $-Si(-O-Si(R^S)_3)_m(R^S)_{3-m}$ (a plurality of $R^S$'s each independently represent an alkyl group having 1 to 5 carbon atoms, and m represents an integer of 0 to 3), a polysiloxane structure, a poly(meth)acrylate structure, a polyolefin structure, and a polyether structure. The alkyl group or aryl group as an organic group may be substituted with only one of these substituents, or may be substituted with two or more of thereof. The methylene group in the alkyl group may be substituted with $-O-$ or $-NHC(O)-$.

One of the suitable aspects of the organic group of the compound B includes an aspect in which the organic group includes at least one structure selected from the group consisting of a polyester structure, a poly(meth)acrylate structure, a polyolefin structure, and a polyether structure. This makes the low reflection properties more excellent.

One of the suitable aspects of the organic group of the compound B also includes an aspect in which the organic group contains a fluorine atom. The content of the fluorine atom in the organic group is preferably 5% by mass or more, more preferably 10% by mass or more, and still more preferably 15% by mass or more.

One of the suitable aspects of the organic group of the compound B also includes an aspect in which the organic group contains a silicon atom. The content of the silicon atom in the organic group is preferably 10% by mass or more, more preferably 20% by mass or more, and still more preferably 30% by mass or more. Specific examples of the aspect in which the organic group contains a silicon atom include an aspect having a group represented by $-Si(-O-Si(R^S)_3)_m(R^S)_{3-m}$ describe above and an aspect having the polysiloxane structure described above.

Only one of these suitable aspects may be satisfied, or two or more thereof may be satisfied from the viewpoint of low reflection properties.

The compound B is preferably a compound represented by the following Formula B from the viewpoint that low reflection properties are more excellent.

$$X^B-Y^B \qquad \text{Formula B}$$

$X^B$ represents a monovalent organic group. The monovalent organic group is the same as the above-described organic group, and the same applies to the suitable aspect thereof.

$Y^B$ represents a functional group. Specific examples of the functional group are the same as those of the above-described functional group, and the same applies to the suitable aspect thereof.

The compound represented by Formula B may be a compound having a molecular weight of 800 or less or may be a compound represented by the following Formula B-1, and it is preferably a compound represented by Formula B-1 from the viewpoint that the effect of the present invention is more excellent.

$$P^B-L-Y^B \qquad \text{Formula B-1}$$

$P^B$ represents a polymer chain. The polymer chain is a group derived from a polymer and contains a predetermined repeating unit. It is preferable that the main chain portion of the polymer chain can be bonded to the above L.

The polymer chain can be selected from known polymers and the like depending on the intended purpose and the like, and examples thereof include polysiloxane, poly(meth)acrylate, polyolefin, polyether, and a copolymer thereof.

L represents a single bond or a divalent linking group. Examples of the divalent linking group include a divalent hydrocarbon group (the divalent hydrocarbon group may be a divalent saturated hydrocarbon group or a divalent aromatic hydrocarbon group; the divalent saturated hydrocarbon group may be either linear, branched, or cyclic, and it preferably has 1 to 20 carbon atoms, where examples thereof include an alkylene group; in addition, the divalent aromatic hydrocarbon group preferably has 5 to 20 carbon atoms, where examples thereof include a phenylene group; and in addition to the above, the divalent saturated hydrocarbon group may be an alkenylene group or an alkynylene group), a divalent heterocyclic group, $-O-$, $-S-$, $-SO_2-$, $-NR_L-$, $-CO-$, $-COO-$, $-CONR_L-$, $-SO_3-$, $-SO_2NR_L-$, or a group obtained by combining two or more of these (for example, an alkyleneoxy group, an alkyleneoxycarbonyl group, or an alkylene carbonyloxy group). Here, $R_L$ represents a hydrogen atom or an alkyl group (preferably having 1 to 10 carbon atoms).

$Y^B$ represents a functional group and is synonymous with the functional group in Formula B.

The modified silica particle is obtained by reacting the reactive group of the modified silica particle precursor with the functional group of the compound B. As a result, a layer (hereinafter, also referred to as a "coating layer B") containing a reactant of the reactive group of the modified silica particle precursor and the functional group of the compound B is formed on the surface of the modified silica particle. In other words, it can be said that the modified silica particle has a silica particle (a particle containing silica) and a coating layer B formed on the surface of the silica particle. The proportion of the covered particle surface of the modified silica particle is preferably 10% or more, more preferably 25% or more, and still more preferably 50% or more of the particle surface.

The coating layer of the modified silica particle preferably has a fluorine atom or a silicon atom, and it more preferably has a fluorine atom, or a polysiloxane structure or a trimethylsilyl group.

[Ultraviolet Absorbing Agent]

The composition according to the embodiment of the present invention may contain an ultraviolet absorbing agent.

In a case where the composition contains an ultraviolet absorbing agent, the content thereof is preferably 0.01% to 10% by mass, more preferably 0.1% to 8% by mass, and still more preferably 1% to 6% by mass, with respect to the total solid content of the composition.

Examples of the ultraviolet absorbing agent include a conjugated diene-based compound, and a compound represented by Formula (I) may be used.

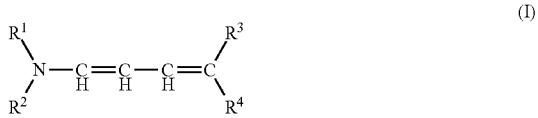

In Formula (I), $R^1$ and $R^2$ each independently represent a hydrogen atom, an alkyl group having 1 to 20 carbon atoms, or an aryl group having 6 to 20 carbon atoms, and $R^1$ and $R^2$ may be the same as different from each other; however, both $R^1$ and $R^2$ do not represent a hydrogen atom at the same time.

In Formula (I), $R^3$ and $R^4$ each independently represent an electron-withdrawing group. The electron-withdrawing group is an electron-withdrawing group having a Hammett's substituent constant $\sigma_p$ value of 0.20 or more and 1.0 or less.

The description of $R^1$ to $R^4$ of the ultraviolet absorbing agent represented by Formula (I), reference can be made to the description in paragraphs 0024 to 0033 of WO2009/123109A (paragraphs 0040 to 0059 of corresponding US2011/0039195A), the content of which is incorporated into the present specification. With regard to the compound represented by Formula (I), reference can be made to the description of the exemplary compounds (1) to (14) in paragraphs 0034 to 0037 of WO2009/123109A (paragraph 0060 of corresponding US2011/0039195A), the content of which is incorporated into the present specification.

[Other Optional Components]

The composition may further contain optional components other than the above-described components. Examples thereof include particulate components other than the above-described components, a silane coupling agent, a sensitizer, a co-sensitizer, a crosslinking agent, a curing accelerator, a heat curing accelerator, a plasticizer, a diluent, and an oil sensitizing agent, and known additives such as an adhesion promoter to the surface of the substrate and other auxiliaries (for example, conductive particles, a filler, an anti-foaming agent, a flame retardant, a leveling agent, a peeling accelerator, an antioxidant, a fragrance, a surface tension adjuster, a chain transfer agent, and the like) may be further contained, as necessary or may not be contained.

Regarding these components, reference can be made to, for example, the descriptions in paragraphs 0183 to 0228 of JP2012-003225A (corresponding to paragraphs 0237 to 0309 of US2013/0034812A), paragraphs 0101, 0102, 0103, 0104, and 0107 to 0109 of JP2008-250074A, and paragraphs 0159 to 0184 of JP2013-195480A, the contents of which are incorporated into the specification of the present application.

[Production Method for Composition]

The composition is preferably a composition obtained by producing a dispersion liquid in which particulate components such as specific particles and/or a black pigment are dispersed, and further mixing the obtained dispersion liquid with other components.

The dispersion liquid is preferably prepared by mixing a particulate component, a resin, and a solvent. In addition, it is also preferable that a polymerization inhibitor is contained in the dispersion liquid.

The dispersion liquid can be prepared by mixing the above-described respective components by known mixing methods (for example, mixing methods using a stirrer, a homogenizer, a high-pressure emulsification device, a wet-type pulverizer, a wet-type disperser, or the like).

In a case of preparing the composition, the respective components may be formulated at once, or each of the components may be dissolved or dispersed in a solvent and then sequentially formulated. Moreover, the input order and the operation conditions during the formulation are not particularly limited.

For the purpose of removing foreign substances, reducing defects, and the like, the composition is preferably filtered with a filter. Any filter can be used without particular limitation as long as it is a filter, for example, which has been used in the related art for the use application to filtration or the like. Examples of the filter include filters made of a fluororesin such as polytetrafluoroethylene (PTFE), a polyamide-based resin such as nylon, and a polyolefin-based resin (having a high density and an ultrahigh molecular weight) such as polyethylene or polypropylene (PP). Among these materials, polypropylene (including high-density polypropylene) and nylon are preferable.

The pore diameter of the filter is preferably 0.1 to 7.0 μm, more preferably 0.2 to 2.5 μm, still more preferably 0.2 to 1.5 μm, and particularly preferably 0.3 to 0.7 μm. In a case where the pore diameter is within the above range, it is possible to reliably remove fine foreign substances, such as impurities and aggregates, contained in a pigment while suppressing filtration clogging of the pigment (including a black pigment).

In a case of using a filter, different filters may be combined. In this case, filtering with a first filter may be carried out only once, or may be carried out twice or more times. In a case where filtering is carried out twice or more times with the combination of different filters, the pore diameters of the filters that are used in the second and subsequent filtering are preferably the same as or larger than the pore diameter of the filter that is used in the first filtering. In addition, the first filters having different pore diameters within the above range may be combined. Regarding the pore diameter mentioned here, reference can be made to nominal values of filter manufacturers. A commercial filter can be selected from various filters provided by, for example, Nihon Pall Ltd., Advantec Toyo Kaisha, Ltd., Nihon Entegris K. K. (formerly Nippon Microlith Co., Ltd.), Kitz Micro Filter Corporation.

As a second filter, a filter formed of the same material as that of the first filter, or the like can be used. The pore diameter of the second filter is preferably 0.2 to 10.0 μm, more preferably 0.2 to 7.0 μm, and still more preferably 0.3 to 6.0 μm.

The composition preferably does not contain impurities such as a metal, a halogen-containing metal salt, an acid, and an alkali. The content of impurities contained in these materials is preferably 1 ppm by mass or less, more preferably 1 ppb by mass or less, still more preferably 100 ppt by mass or less, and particularly preferably 10 ppt by mass or less, and it is most preferable that the impurities are substantially not contained (the content is equal to or less than the detection limit of the measuring device).

Furthermore, the impurities can be measured using an inductively coupled plasma mass spectrometer (manufactured by Agilent Technologies, Inc., Agilent 7500cs model).

[Manufacturing of Cured Film]

A composition layer formed from the composition according to the embodiment of the present invention is cured to obtain a cured film (including a patterned cured film).

The manufacturing method for a cured film is not particularly limited; however, it preferably includes the following steps.

Composition layer forming step
Exposure step
Development step

Hereinafter, each step will be described.

[Composition Layer Forming Step]

In the composition layer forming step, prior to exposure, the composition is applied on a support or the like to form a layer (composition layer) of the composition. As the support, it is possible to use, for example, a substrate (for example, a substrate containing a Si atom such as a silicon substrate or a glass substrate) or a substrate for a solid-state imaging element on which an imaging element (a light-receiving element) such as a CCD or CMOS is provided on the substrate. In addition, in order to improve adhesion with the upper layer, prevent the diffusion of substances, and planarize the surface of the substrate, an undercoat layer may be provided on the support, as needed.

As a method for applying the composition onto the support, for example, various coating methods such as a slit coating method, an ink jet method, a spin coating method, a cast coating method, a roll coating method, and a screen printing method can be applied. The film thickness of the composition layer is preferably 0.1 to 10 µm, more preferably 0.2 to 5 µm, and still more preferably 0.2 to 3 µm. The composition layer applied on the support can be dried (pre-baked) at a temperature of 50° C. to 140° C. for 10 to 300 seconds, for example, using a hot plate, an oven, or the like.

[Exposure Step]

In the exposure step, the composition layer (the dried film) formed in the composition layer forming step is exposed by irradiation with actinic rays or radiation, and the composition layer irradiated with light is cured.

In the method of light irradiation, it is preferable to carry out light irradiation through a photo mask having a patterned opening portion.

The exposure is preferably carried out by irradiation with radiation. The radiation, which can be used during the exposure, is preferably ultraviolet rays such as a g-line, an h-line, or an i-line, and a light source is preferably a high-pressure mercury lamp. The irradiation intensity is preferably 5 to 1,500 mJ/cm$^2$ and more preferably 10 to 1,000 mJ/cm$^2$.

In addition, in a case where the composition contains a thermal polymerization initiator, the composition layer may be heated in the exposure step. The heating temperature is not particularly limited; however, it is preferably 80° C. to 250° C. In addition, the heating time is preferably 30 to 300 seconds.

It is noted that in a case where the composition layer is heated in the exposure step, the exposure step may serve as a post-heating step which will be described later. In other words, in a case where the composition layer is heated in the exposure step, the method of manufacturing a cured film may not include the post-heating step.

[Development Step]

The development step is a step of developing the exposed composition layer to form a cured film. By this step, the composition layer in a portion which is not irradiated with light in the exposure step is eluted, only a photo-cured portion remains, and thus a patterned cured film can be obtained.

The kind of developer used in the development step is not particularly limited; however, an alkali developer which does not damage the underlying imaging element and circuit or the like is desirable.

The development temperature is, for example, 20° C. to 30° C.

The development time is, for example, 20 to 90 seconds. In order to more efficiently remove the residues, in recent years, the development may be carried out for 120 to 180 seconds. Furthermore, in order to further improve residue removability, a step of shaking off the developer every 60 seconds and further supplying a fresh developer may be repeated several times.

The alkali developer is preferably an alkaline aqueous solution which is prepared by dissolving an alkaline compound in water so that the concentration thereof is 0.001% to 10% by mass (preferably 0.01% to 5% by mass).

Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, and 1,8-diazabicyclo[5.4.0]-7-undecene (among them, an organic base is preferable).

It is noted that in a case where the alkaline compound is used as an alkali developer, the alkaline compound is generally subjected to a washing treatment with water after development.

[Post-Baking]

A heating treatment (post-baking) is preferably carried out after the exposure step. The post-baking is a heating treatment after development for completing the curing. The heating temperature is preferably 240° C. or lower and more preferably 220° C. or lower. The lower limit thereof is not particularly limited; however, it is preferably 50° C. or more and more preferably 100° C. or more, in consideration of efficient and effective treatment.

The post-baking can be carried out continuously or batch-wise by using a heating unit such as a hot plate, a convection oven (hot-air circulating dryer), and a high frequency heater.

The post-baking is preferably carried out in an atmosphere of a low oxygen concentration. The oxygen concentration is preferably 19% by volume or less, more preferably 15% by volume or less, still more preferably 10% by volume or less, particularly preferably 7% by volume or less, and most preferably 3% by volume or less. The lower limit thereof is not particularly limited; however, it is practically equal to or higher than 10 ppm by volume.

In addition, the curing may be completed by ultraviolet (UV) irradiation instead of the post-baking with heating described above.

In this case, it is preferable that the composition further contains a UV curing agent. The UV curing agent is preferably a UV curing agent which can be cured at a wavelength shorter than 365 nm which is an exposure wavelength of a polymerization initiator added for a lithography step by ordinary i-line exposure. Examples of the UV curing agent include Omnirad 2959 (corresponding to IRGACURE 2959

(former product name, formerly manufactured by BASF SE) manufactured IGM Resins B.V. In a case where UV irradiation is carried out, the composition layer is preferably a material which is cured at a wavelength of 340 nm or less. The lower limit value of the wavelength is not particularly limited; however, it is generally 220 nm or more. In addition, the exposure amount of the UV irradiation is preferably 100 to 5,000 mJ, more preferably 300 to 4,000 mJ, and still more preferably 800 to 3,500 mJ. The UV curing step is preferably carried out after the exposure step, in order to more effectively carry out low-temperature curing. As an exposure light source, an ozoneless mercury lamp is preferably used.

[Physical Properties of Cured Film and Application of Cured Film]

[Physical Properties of Cured Film]

The cured film formed from the composition according to the embodiment of the present invention can be preferably used as a light shielding film.

In the cured film, the optical density (OD) per film thickness of 1.5 μm in a wavelength range of 400 to 1,200 nm is preferably more than 2.0, more preferably more than 2.5, still more preferably more than 3.0, and particularly preferably more than 3.5, from the viewpoint that excellent light shielding properties are exhibited. It is noted that the upper limit value thereof is not particularly limited; however, in general, it is preferably 10 or less.

In the present specification, the description that the optical density per film thickness of 1.5 μm in a wavelength range of 400 to 1,200 nm is more than 2.0 means that an optical density per film thickness of 1.5 μm in the entire wavelength range of 400 to 1,200 nm is more than 2.0.

In addition, the cured film (the light shielding film) preferably has good light shielding properties against light in the infrared region, and the optical density per film thickness of 1.5 μm in the light having a wavelength of 940 nm is preferably more than 2.0 and more preferably more than 3.0. It is noted that the upper limit value thereof is not particularly limited; however, in general, it is preferably 10 or less.

In a case where the cured film is used as a light attenuating film, it is preferable that the optical density is smaller than the value described above.

In the present specification, as the method of measuring the optical density of the cured film, a cured film is first formed on a glass substrate, and the optical density per predetermined film thickness is calculated by using a spectrophotometer (UV-3600 manufactured by Shimadzu Corporation, or the like).

By the way, even in the state of the composition layer (the dried film) in which the composition is applied and dried, the film thickness and the optical density generally do not change significantly as compared with the state of the cured film which has been subsequently exposed and cured. In such a case, the optical density of the composition layer (the dried film) may be measured by the above-described measuring method, and the obtained value may be used as the optical density of the cured film.

The film thickness of the cured film is, for example, preferably 0.1 to 4.0 μm and more preferably 1.0 to 2.5 μm. The cured film may be thinner or thicker than the above range depending on the application.

It is noted that the "light shielding" using a cured film formed from the composition according to the embodiment of the present invention as the light shielding film is a concept that also includes light attenuation in which light passes through the cured film (the light shielding film) while being attenuated. In a case where a cured film (a light shielding film) is used as the light attenuating film having such a function, the optical density of the cured film may be smaller than the above range.

Furthermore, in a case where the cured film is used as a light attenuating film, the light shielding properties may be adjusted by making the cured film thinner (for example, 0.1 to 0.5 μm) than the above range. In this case, the optical density per film thickness of 1.0 μm in a wavelength range of 400 to 700 nm (and/or light having a wavelength of 940 nm) is preferably 0.1 to 1.5 and more preferably 0.2 to 1.0.

The reflectivity of the cured film is preferably lower than 8%, more preferably lower than 6%, and still more preferably lower than 4%. The lower limit thereof is 0% or more.

The reflectivity mentioned here is obtained from the reflectivity spectrum obtained by causing light having a wavelength of 400 to 1,100 nm to be incident at an incidence angle of 5° using a VAR unit of a spectrometer V7200 (product name) manufactured by JASCO Corporation. Specifically, the reflectivity of light having a wavelength which exhibits the maximum reflectivity in a wavelength range of 400 to 1,100 nm is taken as the reflectivity of the cured film.

In addition, the cured film is suitable for a light shielding member and a light shielding film as well as an antireflection member and an antireflection film of an optical filter and a module that are used in portable instruments such as a personal computer, a tablet PC, a mobile phone, a smartphone, and a digital camera; office automation (OA) instruments such as a printer composite machine and a scanner; industrial instruments such as a surveillance camera, a barcode reader, an automated teller machine (ATM), a high-speed camera, and an instrument having a personal authentication function using face image authentication or biometric authentication; in-vehicle camera instruments; medical camera instruments such as an endoscope, a capsule endoscope, and a catheter; a biological sensor, a biosensor, a military reconnaissance camera, a camera for a three-dimensional map, a camera for observing weather and sea, a camera for a land resource exploration, and space instruments such as an exploration camera for the astronomy of the space and a deep space target.

The cured film can also be used in applications of a micro light emitting diode (LED), a micro organic light emitting diode (OLED). The cured film is suitable for an optical filter and an optical film that are used in the micro LED and the micro OLED as well as a member which imparts a light shielding function or an antireflection function.

Examples of the micro LED and the micro OLED include the examples described in JP2015-500562A and JP2014-533890A.

The cured film is also suitable as an optical film used in a quantum dot sensor and a quantum dot solid-state imaging element. Moreover, the cured film is suitable as a member which imparts a light-shielding function or an antireflection function. Examples of the quantum dot sensor and the quantum dot solid-state imaging element include the examples described in US2012/37789A and WO2008/131313A.

[Light Shielding Film, Optical Element, Solid-State Imaging Element, and Solid-State Imaging Device]

It is also preferable that the cured film according to the embodiment of the present invention is used as a so-called light shielding film. It is also preferable that such a light shielding film is used in a solid-state imaging element.

As described above, the cured film formed from the light shielding composition according to the embodiment of the present invention has excellent light shielding properties and low reflection properties.

Furthermore, the light shielding film is one of the preferable applications in the cured film according to the embodiment of the present invention, and the light shielding film according to the embodiment of the present invention can be manufactured in the same manner as the method of manufacturing a cured film. Specifically, a light shielding film can be manufactured by applying the composition to a substrate to form a composition layer, and carrying out exposure and development on the composition layer.

The present invention also includes an invention of an optical element. The optical element according to the embodiment of the present invention is an optical element including the above-described cured film (light shielding film). Examples of the optical element include an optical element that is used in an optical instrument such as a camera, binoculars, a microscope, and a semiconductor exposure device.

Among them, as the optical element, for example, a solid-state imaging element mounted on a camera or the like is preferable.

In addition, the solid-state imaging element according to the embodiment of the present invention is a solid-state imaging element including the cured film (light shielding film) according to the embodiment of the present invention.

Examples of the form in which the solid-state imaging element according to the embodiment of the present invention includes the cured film (the light shielding film) include a form in which a plurality of photodiodes and light-receiving elements consisting of polysilicon or the like, which constitute a light-receiving area of a solid-state imaging element (a CCD image sensor, a CMOS image sensor, or the like), are provided on a substrate, and the cured film is provided on a surface side (for example, a portion other than light-receiving parts and/or pixels for adjusting color) of a support on which the light-receiving elements are formed or on a side opposite to the surface on which the light-receiving elements are formed.

In addition, in a case where the cured film is used as a light attenuating film, for example, by disposing the light attenuating film so that a part of the light passes through the light attenuating film and then is incident on a light-receiving element, the dynamic range of the solid-state imaging element can be improved.

The solid-state imaging device is equipped with the above-described solid-state imaging element.

Figure 2:
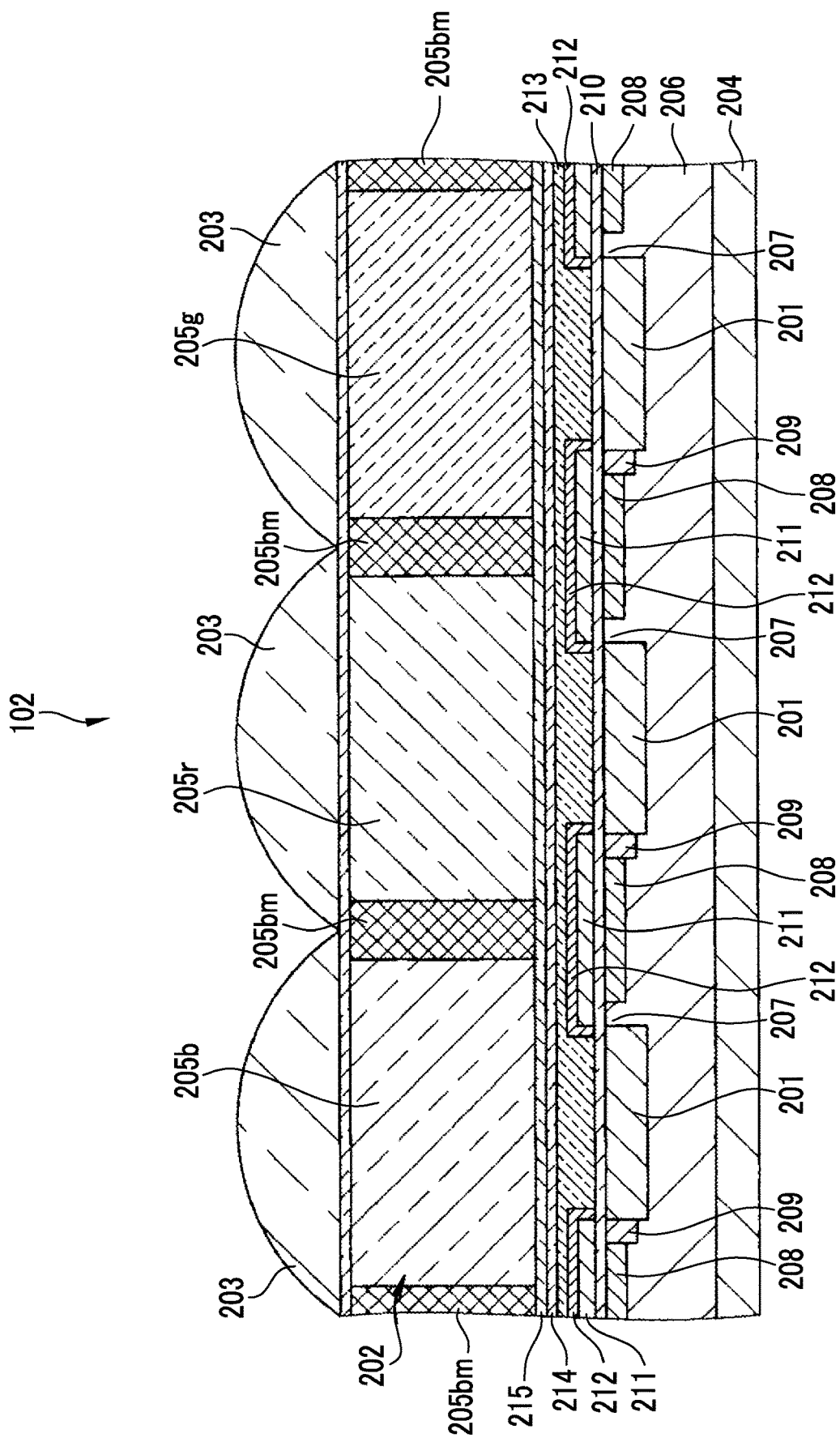
FIG. 2 is a schematic cross-sectional view illustrating an imaging unit included in the solid-state imaging device illustrated in FIG. 1 in an enlarged manner.

Examples of the configurations of the solid-state imaging device and the solid-state imaging element will be described with reference to FIGS. 1 and 2. In FIGS. 1 and 2, some parts are magnified in disregard of the thickness ratio and/or the width ratio between the parts so that the respective parts are clearly displayed.

FIG. 1 is a schematic cross-sectional view illustrating an example of the configuration of the solid-state imaging device including the solid-state imaging element according to the embodiment of the present invention.

As illustrated in FIG. 1, a solid-state imaging device 100 includes a rectangular solid-state imaging element 101 and a transparent cover glass 103 which is held above the solid-state imaging element 101 and seals the solid-state imaging element 101. Further, on the cover glass 103, a lens layer 111 is superposably provided through a spacer 104. The lens layer 111 includes a support 113 and a lens material 112. The lens layer 111 may have a configuration in which the support 113 and the lens material 112 are integrally formed. In a case where stray light is incident on the peripheral edge region of the lens layer 111, due to the diffusion of light, an effect of light condensation on the lens material 112 is weakened, and thus the light reaching an imaging unit 102 is reduced. In addition, noise is also generated due to the stray light. For this reason, a light shielding film 114 is provided in the peripheral edge region of the lens layer 111 so that light is shielded. The cured film according to the embodiment of the present invention can also be used as the light shielding film 114.

The solid-state imaging element 101 carries out photoelectric conversion on an optical image formed on the imaging unit 102 serving as a light-receiving surface of the solid-state imaging element 101, and outputs the converted optical image as an image signal. The solid-state imaging element 101 includes a laminated substrate 105 obtained by laminating two sheets of substrates. The laminated substrate 105 consists of a chip substrate 106 and a circuit board 107 which have the same size and a rectangular shape, and the circuit board 107 is laminated on the rear surface of the chip substrate 106.

As a material of the substrate used as the chip substrate 106, for example, known materials can be used.

The imaging unit 102 is provided in the central part of the surface of the chip substrate 106. In addition, a light shielding film 115 is provided in the peripheral edge region of the imaging unit 102. By shielding stray light incident on the peripheral edge region by the light shielding film 115, the generation of a dark current (noise) from a circuit in the peripheral edge region can be prevented. The cured film according to the embodiment of the present invention is preferably used as the light shielding film 115.

A plurality of electrode pads 108 are provided at an edge part of the surface of the chip substrate 106. The electrode pads 108 are electrically connected to the imaging unit 102 through a signal wire (a bonding wire can also be used) (not shown) provided on the surface of the chip substrate 106.

On the rear surface of the circuit board 107, external connection terminals 109 are provided at positions approximately below the electrode pads 108, respectively. The external connection terminals 109 are respectively connected to the electrode pads 108 through a through-electrode 110 vertically passing through the laminated substrate 105. Moreover, the external connection terminals 109 are connected to a control circuit controlling the driving of the solid-state imaging element 101, an image processing circuit carrying out image processing on an imaging signal output from the solid-state imaging element 101, and the like through a wiring line (not shown).

FIG. 2 shows a schematic cross-sectional view of the imaging unit 102. As illustrated in FIG. 2, the imaging unit 102 includes the parts, such as a light-receiving element 201, a color filter 202, and a micro lens 203, which are provided on a substrate 204. The color filter 202 has a blue pixel 205*b*, a red pixel 205*r*, a green pixel 205*g*, and a black matrix 205*bm*. The cured film according to the embodiment of the present invention may be used as the black matrix 205*bm*.

As the material of the substrate 204, for example, the same material as that of the chip substrate 106 can be used. On the surface layer of the substrate 204, a p-well layer 206 is formed. In the p-well layer 206, the light-receiving elements 201, which consist of an n-type layer and generate and accumulate signal charges by photoelectric conversion, are formed to be arranged in the form of square grids.

On one lateral side of each light-receiving element 201, through a reading gate part 207 on the surface layer of the p-well layer 206, a vertical electric charge transfer path 208 consisting of an n-type layer is formed. In addition, on the other lateral side of each light-receiving element 201, through an element separation region 209 consisting of a p-type layer, a vertical electric charge transfer path 208 belonging to the adjacent pixel is formed. The reading gate part 207 is a channel region for the signal charges accumulated in the light-receiving element 201 to be read out toward the vertical electric charge transfer path 208.

On the surface of the substrate 204, a gate insulating film 210 consisting of an oxide-nitride-oxide (ONO) film is formed. On the gate insulating film 210, vertical electric charge transfer electrodes 211 consisting of polysilicon or amorphous silicon are formed to cover the portions which are approximately immediately above the vertical electric charge transfer path 208, the reading gate part 207, and the element separation region 209. The vertical electric charge transfer electrodes 211 function as driving electrodes for driving the vertical electric charge transfer path 208 and carrying out charge transfer, and as reading electrodes for driving the reading gate part 207 and reading out signal charges. The signal charges are transferred to a horizontal electric charge transfer path and an output part (floating diffusion amplifier), which are not shown in the drawing, in this order from the vertical electric charge transfer path 208, and then output as voltage signals.

On each of the vertical electric charge transfer electrodes 211, a light shielding film 212 is formed to cover the surface of the electrode. The light shielding film 212 has an opening portion at a position immediately above the light-receiving element 201 and shields a region other than the opening portion from light. The cured film according to the embodiment of the present invention may be used as the light shielding film 212.

On the light shielding film 212, a transparent interlayer, which consists of an insulating film 213 consisting of borophosphosilicate glass (BPSG), an insulating film (passivation film) 214 consisting of P—SiN, and a planarization film 215 consisting of a transparent resin or the like, is provided. The color filter 202 is formed on the interlayer.

[Image Display Device]

An image display device according to the embodiment of the present invention is equipped with the cured film according to the embodiment of the present invention.

Examples of the form in which the image display device includes a cured film include a form in which a cured film is contained in a black matrix and a color filter including such a black matrix is used in an image display device.

Next, a black matrix and a color filter including the black matrix will be described, and a liquid crystal display device including such a color filter will be described as a specific example of the image display device.

<Black Matrix>

It is also preferable that the cured film according to the embodiment of the present invention is contained in the black matrix. The black matrix may be included a color filter, a solid-state imaging element, and an image display device such as a liquid crystal display device in some cases.

Examples of the black matrix include those described above; a black rim provided in the peripheral edge part of an image display device such as a liquid crystal display device; a lattice-formed and/or stripe-like black portion between pixels of red, blue, and green; and a dot-like and/or linear black pattern for shielding a thin film transistor (TFT) from light. The definition of the black matrix is described in, for example, "Glossary of liquid crystal display manufacturing device", written by Yasuhira KANNO, 2nd edition, NIKKAN KOGYO SHIMBUN, LTD., 1996, p. 64.

In order to improve the display contrast, and to prevent image quality deterioration resulting from current leakage of light in a case of an active matrix driving-type liquid crystal display device using a thin film transistor (TFT), the black matrix preferably has high light shielding properties (the optical density OD is equal to or higher than 3).

As the method of manufacturing the black matrix, for example, the black matrix can be manufactured in the same manner as the method of manufacturing the cured film. Specifically, by applying the composition onto a substrate to form a composition layer and carrying out exposure and development on the composition layer, a patterned cured film (a black matrix) can be manufactured. Moreover, the film thickness of the cured film used as the black matrix is preferably 0.1 to 4.0 µm.

The material of the substrate preferably has a light transmittance equal to or greater than 80% for visible light (wavelength of 400 to 800 nm). Examples of such a material include: glass such as soda lime glass, alkali-free glass, quartz glass, and borosilicate glass; and plastic such as a polyester-based resin and a polyolefin-based resin, and from the viewpoints of chemical resistance and heat resistance, alkali-free glass, quartz glass, or the like is preferable.

<Color Filter>

It is also preferable that the cured film according to the embodiment of the present invention is included in a color filter.

Examples of the form in which the color filter includes the cured film include a color filter comprising a substrate and the above-described black matrix. That is, examples thereof include a color filter comprising colored pixels of red, green, and blue which are formed in the opening portion of the black matrix formed on a substrate.

The color filter including a black matrix (cured film) can be manufactured, for example, according to the following method.

First, in an opening portion of a patterned black matrix formed on a substrate, a coating film (composition layer) of a composition containing each of pigments corresponding to the respective colored pixels of the color filter is formed. It is noted that as the composition for each color, for example, a known composition can be used; however, in the composition described in the present specification, it is preferable that a composition in which the black coloring material is replaced with a coloring agent corresponding to each pixel is used.

Subsequently, the composition layer is subjected to exposure through a photo mask having a pattern corresponding to the opening portion of the black matrix. Next, colored pixels can be formed in the opening portion of the black matrix by removing non-exposed portions by a development treatment, and then carrying out baking. In a case where the series of operations are carried out using, for example, a composition for each color containing each of red, green, and blue pigments, a color filter having red, green, and blue pixels can be manufactured.

<Liquid Crystal Display Device>

It is also preferable that the cured film according to the embodiment of the present invention is included in a liquid crystal display device. Examples of the form in which the liquid crystal display device includes the cured film include a form in which a liquid crystal display device includes the color filter including the black matrix (cured film) described above.

Examples of the liquid crystal display device according to the present embodiment include a form in which a liquid crystal display device comprises a pair of substrates disposed to face each other and a liquid crystal compound sealed in the space between the substrates. The substrates are as described above, for example, as the substrate for a black matrix.

Examples of a specific form of the liquid crystal display device include a laminate including polarizing plate/substrate/color filter/transparent electrode layer/alignment film/liquid crystal layer/alignment film/transparent electrode layer/thin film transistor (TFT) element/substrate/polarizing plate/backlight unit in this order from the user side.

In addition, examples of the liquid crystal display device include the liquid crystal display devices described in "Electronic display device (written by Akio SASAKI, Kogyo Chosakai Publishing Co., Ltd., published in 1990)", "Display device (written by Sumiaki IBUKI, Sangyo Tosho Publishing Co., Ltd., published in 1989)", or the like. Moreover, examples thereof include the liquid crystal display device described in "Next-Generation Liquid Crystal Display Technology (edited by Tatsuo UCHIDA, Kogyo Chosakai Publishing Co., Ltd., published in 1994)".

[Infrared Sensor]

It is also preferable that the cured film according to the embodiment of the present invention is included in an infrared sensor.

Figure 3:
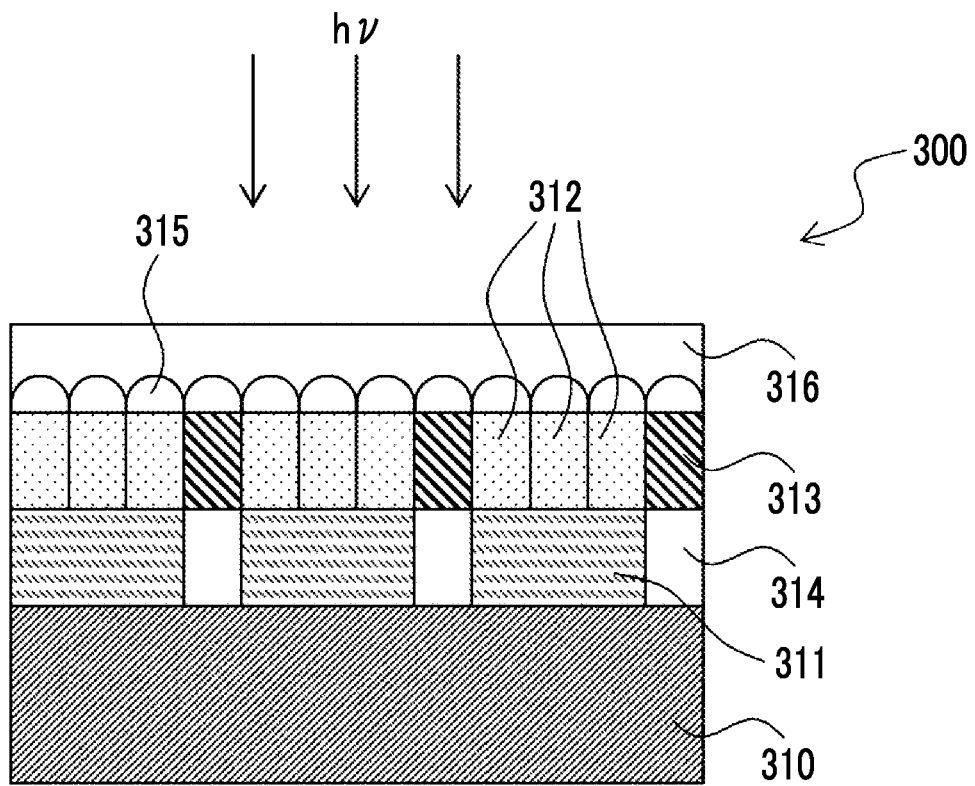
FIG. 3 is a schematic cross-sectional view illustrating an example of a configuration of an infrared sensor.

The infrared sensor according to the embodiment will be described with reference to FIG. 3. FIG. 3 is a schematic cross-sectional view illustrating an example of the configuration of an infrared sensor comprising the cured film according to the embodiment of the present invention. An infrared sensor 300 illustrated in FIG. 3 includes a solid-state imaging element 310.

An imaging region provided on the solid-state imaging element 310 is configured by combining an infrared absorption filter 311 and a color filter 312 according to the embodiment of the present invention.

The infrared absorption filter 311 is a film which transmits light (for example, light having a wavelength of 400 to 700 nm) in the visible light range and shields light (for example, light having a wavelength of 800 to 1,300 nm, preferably light having a wavelength of 900 to 1,200 nm, and more preferably light having a wavelength of 900 to 1,000 nm) in the infrared range, and a cured film containing an infrared absorbing agent (the form of the infrared absorbing agent is as described above) as a coloring agent can be used.

The color filter 312 is a color filter in which pixels transmitting or absorbing light having a specific wavelength in the visible light range are formed, for example, a color filter in which pixels of red (R), green (G), and blue (B) are formed, or the like is used, and the form thereof is as described above.

Between an infrared transmitting filter 313 and the solid-state imaging element 310, a resin film 314 (for example, a transparent resin film or the like), which is capable of transmitting light having the wavelength transmitted through the infrared transmitting filter 313, is disposed.

The infrared transmitting filter 313 is a filter which has visible light shielding properties and transmits infrared rays having a specific wavelength, and the cured film according to the embodiment of the present invention can be used, which contains a coloring agent (for example, a perylene compound and/or a bisbenzofuranone compound) absorbing light in a visible light range, and an infrared absorbing agent (for example, a pyrrolo pyrrole compound, a phthalocyanine compound, a naphthalocyanine compound, a polymethine compound, or the like). It is preferable that, for example, the infrared transmitting filter 313 shields light having a wavelength of 400 to 830 nm and transmits light having a wavelength of 900 to 1,300 nm.

On the incidence ray hv side of the color filter 312 and the infrared transmitting filter 313, micro lenses 315 are arranged. A planarization film 316 is formed to cover the micro lenses 315.

In the form illustrated in FIG. 3, the resin film 314 is disposed; however, the infrared transmitting filter 313 may be formed instead of the resin film 314. That is, on the solid-state imaging element 310, the infrared transmitting filter 313 may be formed.

In the form illustrated in FIG. 3, the film thickness of the color filter 312 is the same as the film thickness of the infrared transmitting filter 313, but both the film thicknesses may be different from each other.

In the form illustrated in FIG. 3, the color filter 312 is provided to be closer to the incidence ray hv side than the infrared absorption filter 311, but the order of the infrared absorption filter 311 and the color filter 312 may be switched so that the infrared absorption filter 311 is provided to be closer to the incidence ray hv side than the color filter 312.

In the form illustrated in FIG. 3, the infrared absorption filter 311 and the color filter 312 are laminated to be adjacent to each other, but both the filters are not necessarily adjacent to each other, and another layer may be provided between the filters. The cured film according to the embodiment of the present invention can be used as a light shielding film on an end part of the surface and/or a lateral surface of the infrared absorption filter 311, and in a case of being used in an interior wall of a device of an infrared sensor, the internal reflection and/or the unintended incidence of light on the light-receiving part can be prevented and thus sensitivity can be improved.

According to the infrared sensor, image information can be simultaneously taken in, and thus motion sensing or the like by which a subject whose movement is to be detected is recognized can be carried out. In addition, according to the infrared sensor, distance information can be obtained, and thus images including 3D information and the like can also be captured. Furthermore, the infrared sensor can also be used as a biometric authentication sensor.

Next, a solid-state imaging device to which the above-described infrared sensor is applied will be described.

The solid-state imaging device includes a lens optical system, a solid-state imaging element, an infrared light emitting diode. Furthermore, regarding each of the configurations of the solid-state imaging device, reference can be made to paragraphs 0032 to 0036 of JP2011-233983A, the contents of which are incorporated into the specification of the present application.

[Headlight Unit]

It is also preferable that the cured film according to the embodiment of the present invention is included, as the light shielding film, in a headlight unit for a vehicle such as an automobile. The cured film according to the embodiment of the present invention, which is included in the headlight unit as the light shielding film, is preferably formed in a patterned manner to shield at least a part of light emitted from a light source.

Figure 4:
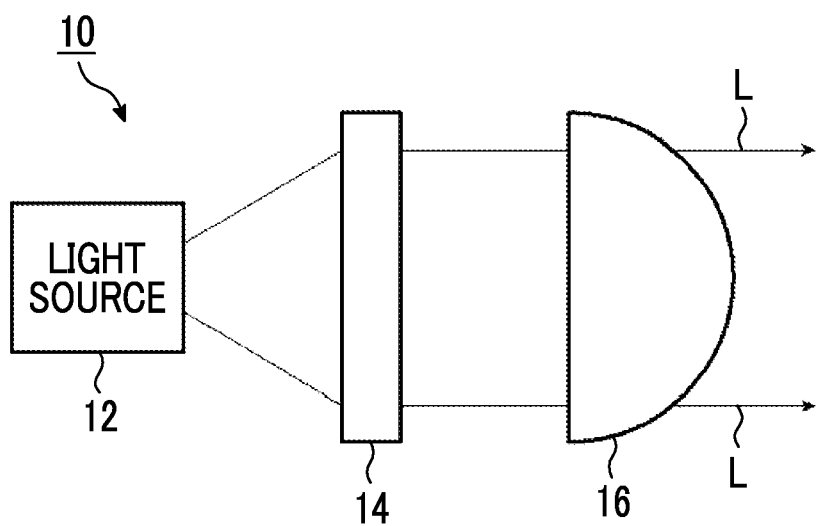
FIG. 4 is a schematic view illustrating an example of a configuration of a headlight unit.

The headlight unit according to the embodiment will be described with reference to FIGS. 4 and 5. FIG. 4 is a schematic view illustrating an example of the configuration of the headlight unit, and FIG. 5 is a schematic perspective view illustrating an example of the configuration of a light shielding unit of the headlight unit.

As illustrated in FIG. 4, a headlight unit 10 includes a light source 12, a light shielding unit 14, and a lens 16, and the light source 12, the light shielding unit 14, and the lens 16 are arranged in this order.

Figure 5:
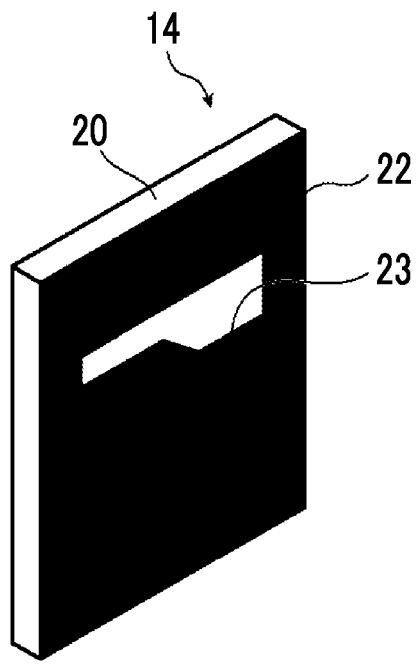
FIG. 5 is a schematic perspective view illustrating an example of a configuration of a light shielding unit of the headlight unit.

As illustrated in FIG. 5, the light shielding unit 14 has a base body 20 and a light shielding film 22.

In the light shielding film 22, a patterned opening portion 23 for radiating light emitted from the light source 12 into a specific shape is formed. A light distribution pattern radiated from the lens 16 is determined by the shape of the opening portion 23 of the light shielding film 22. The lens 16 projects light L from the light source 12, which has passed through the light shielding unit 14. In a case where a specific light distribution pattern can be radiated from the light source 12, the lens 16 is not necessarily required. The lens 16 is appropriately determined according to an irradiation distance and an irradiation range of the light L.

In addition, the configuration of the base body 20 is not particularly limited as long as the substrate can hold the light shielding film 22. However, the base body 20 is preferably not deformed by the heat of the light source 12, and it is, for example, made of glass.

An example of the light distribution pattern is illustrated in FIG. 5, which is not limited thereto.

In addition, the number of the light sources 12 is also not limited to one, and the light sources may be arranged, for example, in a row or in a matrix. In a case where a plurality of light sources are provided, for example, one light shielding unit 14 may be provided for one light source 12. In this case, the respective light shielding film 22 of a plurality of light shielding units 14 may all have the same pattern or may have different patterns.

The light distribution pattern based on the pattern of the light shielding film 22 will be described.

Figure 6:
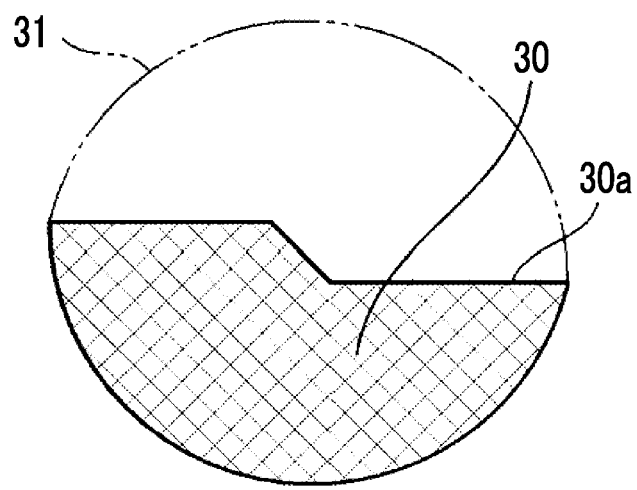
FIG. 6 is a schematic view illustrating an example of a light distribution pattern formed by the light shielding unit of the headlight unit.
Figure 7:
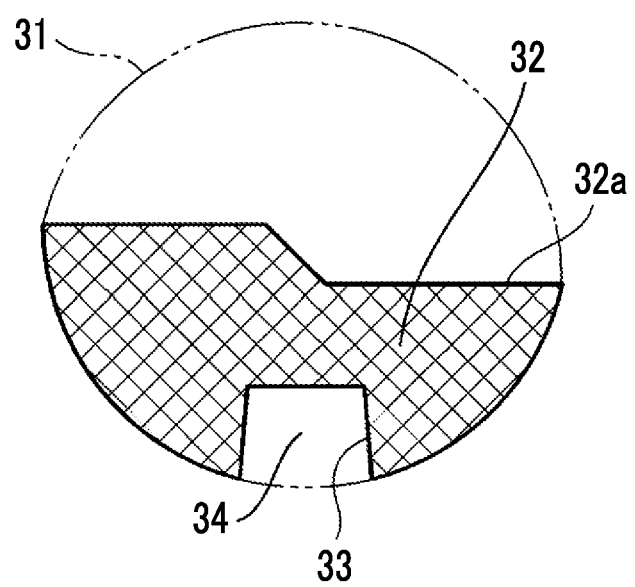
FIG. 7 is a schematic view illustrating another example of the light distribution pattern formed by the light shielding unit of the headlight unit.

FIG. 6 is a schematic view illustrating an example of the light distribution pattern formed by the headlight unit, and FIG. 7 is a schematic view illustrating another example of the light distribution pattern formed by the headlight unit. It is noted that a light distribution pattern 30 illustrated in FIG. 6 and a light distribution pattern 32 illustrated in FIG. 7 both indicate a region irradiated with light. Further, a region 31 illustrated in FIG. 6 and a region 31 illustrated in FIG. 7 both indicate an irradiation region irradiated by the light source 12 (see FIG. 4) in a case where the light shielding film 22 is not provided.

Due to the pattern of the light shielding film 22, the intensity of light is sharply reduced at an edge 30a, for example, as in the light distribution pattern 30 illustrated in FIG. 6. The light distribution pattern 30 illustrated in FIG. 6 is, for example, a pattern in which light is not flashed at an oncoming vehicle in a case of left-side traveling.

In addition, as in the light distribution pattern 32 illustrated in FIG. 7, a pattern in which a part of the light distribution pattern 30 illustrated in FIG. 6 is notched can also be used. Also in this case, similar to the light distribution pattern 30 illustrated in FIG. 6, the intensity of light is sharply reduced at an edge 32a, and the pattern is, for example, a pattern in which light is not flashed at an oncoming vehicle in a case of left-side traveling. Further, the intensity of light is sharply reduced even at a notched portion 33. Therefore, in a region 34 corresponding to the notched portion 33, a mark indicating a state where the road is curved, inclined upward, inclined downward, or the like can be displayed. By doing so, safety during night-time traveling can be improved.

In addition, the light shielding unit 14 is not limited to being fixedly disposed between the light source 12 and the lens 16, and a configuration in which the light shielding unit 14 is allowed to enter between the light source 12 and the lens 16, as necessary, by a driving mechanism (not shown) to obtain a specific light distribution pattern may be adopted.

In addition, in the light shielding unit 14, a shade member capable of shielding the light from the light source 12 may be formed. In this case, a configuration in which the shade member is allowed to enter between the light source 12 and the lens 16, as necessary, by the driving mechanism (not shown) to obtain a specific light distribution pattern may be adopted.

EXAMPLES

Hereinbelow, the present invention will be described in more detail with reference to Examples. The materials, the amounts and proportions of the materials used, the details of treatments, the procedure of treatments, and the like shown in the following Examples can be appropriately modified as long as the gist of the present invention is maintained. Accordingly, the scope of the present invention will not be restrictively interpreted by the following Examples.

<<Test X>>

[Production of Composition]

Hereinafter, each component used in the preparation of the composition will be described.

[Particles]

Particles produced by the method described below were used to prepare the composition.

It is noted that All of the following particles correspond to the black pigment.

<Manufacturing of Zr Particle Z-1>

A zirconium-containing particle (hereinafter, also referred to as a "Zr particle") Z-1 was manufactured by using a device equivalent to the black composite fine particle manufacturing device described in FIG. 1 of WO2010/147098A.

In the black composite fine particle manufacturing device, high frequency voltages of about 4 MHz and about 80 kVA were applied to the high frequency oscillation coil of the plasma torch, and a mixed gas of an argon gas of 50 L/min and a nitrogen gas of 50 L/min was supplied as a plasma gas from the plasma gas supply source to generate an argon-nitrogen thermal plasma flame in the plasma torch. Further, a carrier gas of 10 L/min was supplied from the spray gas supply source of the material supply device.

Then, zirconium chloride (white powder, manufactured by FUJIFILM Wako Pure Chemical Corporation), addition particles (an Fe powder manufactured by JFE Steel Corporation, JIP270M, particle diameter: 150 μm or less), and liquid ammonia (manufactured by UBE Corporation) were suppled together with an argon gas, which is a carrier gas, into a thermal plasma flame in the plasma torch, vaporized in the thermal plasma flame, and highly dispersed in a gas phase state. It is noted that the adding amount of the addition particles was 0.05% by mass with respect to the 100% by mass of the total mass of the zirconium chloride and the addition particles.

In addition, nitrogen was used as the gas supplied into the chamber by the gas supply device. At this time, the flow rate in the chamber was set to 5 m/sec, and the supply amount was set to 1,000 L/min. Further, the pressure inside the cyclone was set to 50 kPa, and the supply rates of zirconium chloride and addition particles from the chamber to the cyclone were set to 10 m/s (in terms of average value).

Next, the particles obtained by using the black composite fine particle manufacturing device were subjected to a heat treatment using a Lab Kiln L/K manufactured by NARA MACHINERY Co., Ltd. as a calcination furnace. Specifically, the heat treatment was carried out at 240° C. for 3 hours while supplying nitrogen at 100 mL/min as an atmospheric gas to the calcination furnace.

In this way, a Zr particle Z-1 was obtained. Z-1 is a zirconium oxynitride particle.

<Manufacturing of Zr Particles Z-2 to Z-12, Z-15, Z-16, ZZ-1, and ZZ-2>

Zr particles Z-2 to Z-12, Z-15, Z-16, ZZ-1, and ZZ-2 were manufactured in the same manner, except that in the above-described manufacturing method for Z-1, the adding amount of the addition particle and the heat treatment conditions were set as shown in Table 1, which would be shown later. All of the Zr particles Z-2 to Z-12, Z-15, Z-16, ZZ-1, and ZZ-2 are zirconium oxynitride particles.

<Manufacturing of Zr Particle Z-13 (Particle Containing a Coating Layer Consisting of Silica)>

12 mol of ethanol as alcohol with respect to 0.1 mol of Z-2 was added, Z-2 was dispersed in the ethanol, and the resultant was subjected to wet-type pulverization by a beads mill to obtain a dispersion liquid of Z-2. Subsequently, 6 mol of ethanol for adjusting the concentration was added to the dispersion liquid of Z-2, and then $1\times10^{-2}$ mol of tetramethyl orthosilicate was added as a silica source for forming a silica film. Next, $1\times10^{-3}$ mol of sodium hydroxide as an alkali source (reaction initiator) was added to the dispersion liquid of Z-2 to which the tetramethyl orthosilicate had been added, and a reaction with the dispersion liquid was started. Moreover, this dispersion liquid was washed, dried, and then calcined to obtain a Zr particle Z-13 of which the core portion had been coated with a silica film.

In addition, the washing of the dispersion liquid was carried out by passing the dispersion liquid through a centrifugal separator, and then passing the dispersion liquid through an ion exchange resin-made filter, in order to remove impurities from the dispersion liquid. Moreover, the calcination was a treatment of holding at 350° C. for 5 hours in an atmosphere of a nitrogen gas.

In Z-13, the content of the metal oxide (metal oxide coating layer consisting of silica) with respect to the total mass of the Z-13 was 5% by mass.

<Manufacturing of Zr Particle Z-14 (Particle Containing a Coating Layer Consisting of Alumina)>

The above-described Z-2 was mixed with water, and the mixture was adjusted, by using a sand mill, to an aqueous slurry having a weight of 100 g/liter in terms of the Z-2 powder, thereby obtaining an aqueous dispersion liquid having a powder concentration of 100 g/liter. This slurry was heated to 60° C. while stirring, a sodium aluminate aqueous solution and a dilute sulfuric acid solution were simultaneously added for 30 minutes while maintaining the temperature and maintaining the pH of the aqueous slurry at 7.0, followed by aging for 30 minutes.

Then, the obtained neutralization reaction product was filtered, washed, and dried at a temperature of 120° C. for 5 hours to obtain a Zr particle Z-14 of which the core portion had been coated with an alumina film.

It is noted that the adding amount of the sodium aluminate aqueous solution was adjusted, within a range of an amount equivalent to 0.1 to 25 parts by mass as $Al_2O_3$ with respect to 100 parts by mass of Z-2, so that the content of the metal oxide (metal oxide coating layer made of alumina) with respect to the total mass of Z-14 to be finally obtained was 5% by mass.

The contents of the zirconium (Zr) atom, the iron (Fe) atom, and the chlorine (Cl) atom were measured for each of the obtained Zr particles by the ICP emission spectroscopic analysis method. For the ICP emission spectroscopic analysis method, an ICP emission spectroscopic analysis apparatus "SPS3000" (product name) manufactured by Seiko Instruments Inc. was used.

In addition, the content of the nitrogen atoms was measured in the same manner for the obtained Zr particles. For the content of the nitrogen atom, the measurement was carried out using an oxygen/nitrogen analysis apparatus "EMGA-620 W/C" (product name) manufactured by HORIBA, Ltd., and the calculation was carried out according to the inert gas fusion-thermal conductivity method. The results are shown in Table 1.

The table below shows the manufacturing conditions of each Zr particle and the analysis results.

It is noted that in the table below, Zr particles Z-1 to Z-16 are the specific particles.

In the table, the column of "Adding amount" in the column of "Addition particle" and the column of "Adding amount" in the column of "Zirconium chloride" each indicates the proportion of each component with respect to 100% by mass of the total mass of zirconium chloride and the addition particle in a case where the Zr particle is manufactured.

The column of "Heat treatment condition" indicates the temperature and the time of the heat treatment in a case where the heat treatment is carried out in the calcination furnace.

The column of "Coating layer" indicates the presence or absence of the coating layer in each Zr particle, or the material of the coating layer.

The column of "Fe atom/Cl atom" indicates the mass ratio of the content of the Fe atom to the content of the Cl atom (the content mass of the Fe atom/the content mass of the Cl atom) in each Zr particle.

The column of "Atomic composition" indicates the content (in terms of % by mass) of each atom in each Zr particle with respect to the total mass of the Zr particle. In each Zr particle, 80% by mass or more of the residual part other than the Zr atom, the N atom, the Fe atom, and the Cl atom is the oxygen atom.

It is noted that the average primary particle diameter of each Zr particle was in a range of 20 to 30 nm.

TABLE 1

| | Manufacturing condition | | | | Composition of Zr particle | | | | |
|---|---|---|---|---|---|---|---|---|---|
| | Raw material | | | | Atomic composition | | | | |
| | Addition particle Adding amount | Zirconium chloride Adding amount | Heat treatment condition | Coating layer | Zr content (% by mass) | N content (% by mass) | Fe content (% by mass) | Cl content (% by mass) | Fe atom/ Cl atom |
| Z-1 | 0.05% by mass | Residual part | 240° C., 3 hours | Absent | 48 | 33 | 0.003 | 0.100 | 0.030 |
| Z-2 | 0.3% by mass | Residual part | 240° C., 3 hours | Absent | 47 | 33 | 0.020 | 0.100 | 0.200 |
| Z-3 | 0.4% by mass | Residual part | 240° C., 3 hours | Absent | 47 | 33 | 0.030 | 0.100 | 0.300 |
| Z-4 | 0.5% by mass | Residual part | 240° C., 3 hours | Absent | 47 | 32 | 0.100 | 0.100 | 1.000 |
| Z-5 | 0.6% by mass | Residual part | 240° C., 3 hours | Absent | 47 | 32 | 0.150 | 0.100 | 1.500 |
| Z-6 | 1% by mass | Residual part | 240° C., 3 hours | Absent | 47 | 32 | 0.200 | 0.100 | 2.000 |

TABLE 1-continued

| | Manufacturing condition | | | | Composition of Zr particle | | | | |
|---|---|---|---|---|---|---|---|---|---|
| | Raw material | | | | Atomic composition | | | | |
| | Addition particle Adding amount | Zirconium chloride Adding amount | Heat treatment condition | Coating layer | Zr content (% by mass) | N content (% by mass) | Fe content (% by mass) | Cl content (% by mass) | Fe atom/ Cl atom |
| Z-7 | 1% by mass | Residual part | 240° C., 3 hours | Absent | 47 | 32 | 0.250 | 0.100 | 2.500 |
| Z-8 | 1.7% by mass | Residual part | 240° C., 3 hours | Absent | 48 | 33 | 0.300 | 0.100 | 3.000 |
| Z-9 | 0.3% by mass | Residual part | 240° C., 1 hour | Absent | 47 | 33 | 0.020 | 0.150 | 0.133 |
| Z-10 | 0.3% by mass | Residual part | 240° C., 0.5 hours | Absent | 47 | 33 | 0.020 | 0.200 | 0.100 |
| Z-11 | 0.3% by mass | Residual part | 240° C., 0.1 hours | Absent | 47 | 33 | 0.020 | 0.270 | 0.074 |
| Z-12 | 0.3% by mass | Residual part | Absent | Absent | 47 | 33 | 0.020 | 0.460 | 0.043 |
| Z-13 | 0.3% by mass | Residual part | 240° C., 3 hours | Silica | 47 | 33 | 0.019 | 0.095 | 0.200 |
| Z-14 | 0.3% by mass | Residual part | 240° C., 3 hours | Alumina | 47 | 33 | 0.019 | 0.095 | 0.200 |
| Z-15 | 1.7% by mass | Residual part | 240° C., 24 hours | Absent | 47 | 33 | 0.300 | Less than 0.001 | More than 300 |
| Z-16 | 0.05% by mass | Residual part | Absent | Absent | 47 | 33 | 0.003 | 0.460 | 0.007 |
| ZZ-1 | 0% by mass | Residual part | 240° C., 3 hours | Absent | 48 | 33 | Less than 0.001 | 0.100 | 0 |
| ZZ-2 | 2% by mass | Residual part | 240° C., 3 hours | Absent | 48 | 33 | 0.420 | 0.100 | 4.200 |

<Manufacturing of Ti Particle (Particle Containing Titanium) Ti-1>

100 g of titanium oxide MT-150A (product name; manufactured by TAYCA CORPORATION) having an average primary particle diameter of 15 nm, 25 g of silica particle AEROPERL (registered product name) 300/30 (manufactured by Evonik Industries AG) having a BET surface area of 300 m²/g, and 100 g of dispersing agent Disperbyk 190 (product name; manufactured by BYK Additives & Instruments) were weighed, and these were added to 71 g of ion exchange water to obtain a mixture.

Then, the mixture was treated for 20 minutes at a revolution speed of 1,360 rpm and a rotation speed of 1,047 rpm using MAZERUSTAR KK-400 W manufactured by KURABO INDUSTRIES LTD. to obtain a mixed solution. A quartz vessel was filled with this mixed solution and heated to 920° C. in an oxygen atmosphere using a small-sized rotary kiln (manufactured by MOTOYAMA Co., Ltd.). Then, the atmosphere in the small-sized rotary kiln was replaced with nitrogen, and at the same temperature, an ammonia gas was allowed to flow into the small-sized rotary kiln at 100 mL/min for 5 hours to carry out the nitridization reduction treatment. After the completion of the treatment, the collected powder was pulverized in a mortar to obtain a powdery titanium black Ti-1 [a substance to be dispersed, containing titanium black (an oxynitride of titanium) particles and Si atoms, specific surface area: 73 m²/g] containing Si atoms.

<Carbon Black CB-1>

"Color Black S170 (product name, average primary particle diameter: 17 nm, BET specific surface area: 200 m²/g, carbon black manufactured according to the gas black method)", which is a carbon black manufactured by Degussa AG, was denoted as carbon black CB-1.

[Dispersing Agent]

The following dispersing agent was used.

Dispersing Agent A

The dispersing agent A is a dispersing agent produced by the manufacturing method described below.

Synthesis Example A1: Synthesis of Macromonomer A-1

ε-caprolactone (1,044.2 g), δ-valerolactone (184.3 g), and 2-ethyl-1-hexanol (71.6 g) were introduced into a three-neck flask having a volume of 3,000 mL to obtain a mixture. Next, the above-described mixture was stirred while blowing nitrogen. Next, Disperbyk 111 (12.5 g, manufactured by BYK Additives & Instruments, a phosphoric acid resin) was added to the mixture, and the obtained mixture was heated to 90° C. After 6 hours, using ¹H-nuclear magnetic resonance (NMR), it was confirmed that a signal derived from 2-ethyl-1-hexanol in the mixture had disappeared, and then the mixture was heated to 110° C. After the polymerization reaction was continued at 110° C. for 12 hours under nitrogen, the disappearance of the signals derived from ε-caprolactone and δ-valerolactone was confirmed by ¹H-NMR, and the molecular weight of the resulting compound was measured by gel permeation chromatography (GPC). After confirming that the molecular weight of the compound reached a desired value, 2,6-di-t-butyl-4-methylphenol (0.35 g) was added to the mixture containing the compound, and then 2-methacryloyloxyethyl isocyanate (87.0 g) was added dropwise to the obtained mixture over 30 minutes. Six hours after the completion of the dropwise addition, disappearance of a signal derived from 2-methacryloyloxyethyl isocyanate (MOI) was confirmed by ¹H-NMR, and then propylene glycol monomethyl ether acetate (PGMEA) (1,387.0 g) was added to the mixture to obtain a macromonomer A-1 solution (2,770 g) having a concentration of 50% by mass. The weight-average molecular weight of the obtained macromonomer A-1 was 6,000.

Synthesis Example P-1: Synthesis of Dispersing Agent A

A macromonomer A-1 (200.0 g), methacrylic acid (hereinafter, also referred to as "MAA", 60.0 g), benzyl methacrylate (hereinafter, also referred to as "BzMA", 40.0 g), propylene glycol 1-monomethyl ether 2-acetate (PGMEA, 366.7 g) were introduced into a three-neck flask having a volume of 1,000 mL to obtain a mixture. The above mixture was stirred while blowing nitrogen. Next, the mixture was warmed to 75° C. while allowing nitrogen to flow into the flask. Next, dodecyl mercaptan (5.85 g), then 2,2'-azobis (methyl 2-methylpropionate) (1.48 g, hereinafter, also referred to as "V-601") were added to the mixture to initiate the polymerization reaction. After heating the mixture at 75° C. for 2 hours, V-601 (1.48 g) was further added to the mixture. After 2 hours, V-601 (1.48 g) was further added to the mixture. After the reaction for 2 hours, the mixture was further added to 90° C. and stirred for 3 hours. By the above operation, the polymerization reaction was completed and the dispersing agent A was obtained.

Dispersing Agent B

The dispersing agent B is a dispersing agent produced by the manufacturing method described below.

Tetrabutylammonium bromide (TBAB, 7.5 g) and p-methoxyphenol (MEHQ, 0.13 g) were added to a solution of the dispersing agent A obtained in Synthesis Example P-1 in atmospheric air, and then glycidyl methacrylate (GMA, 66.1 g) was added dropwise thereto. After the completion of the dropwise addition, the reaction was continued in the air for 7 hours, and then the completion of the reaction was confirmed by acid value measurement. PGMEA (643.6 g) was added to the resulting mixture to obtain a 20% by mass solution of the dispersing agent B. The weight-average molecular weight of the obtained dispersing agent B was 35,000, and the acid value thereof was 50 mgKOH/mg.

The structures of the dispersing agents C to H are shown below.

In the structural formulae of the dispersing agents C to F, the numerical value noted to each repeating unit indicates the mass ratio.

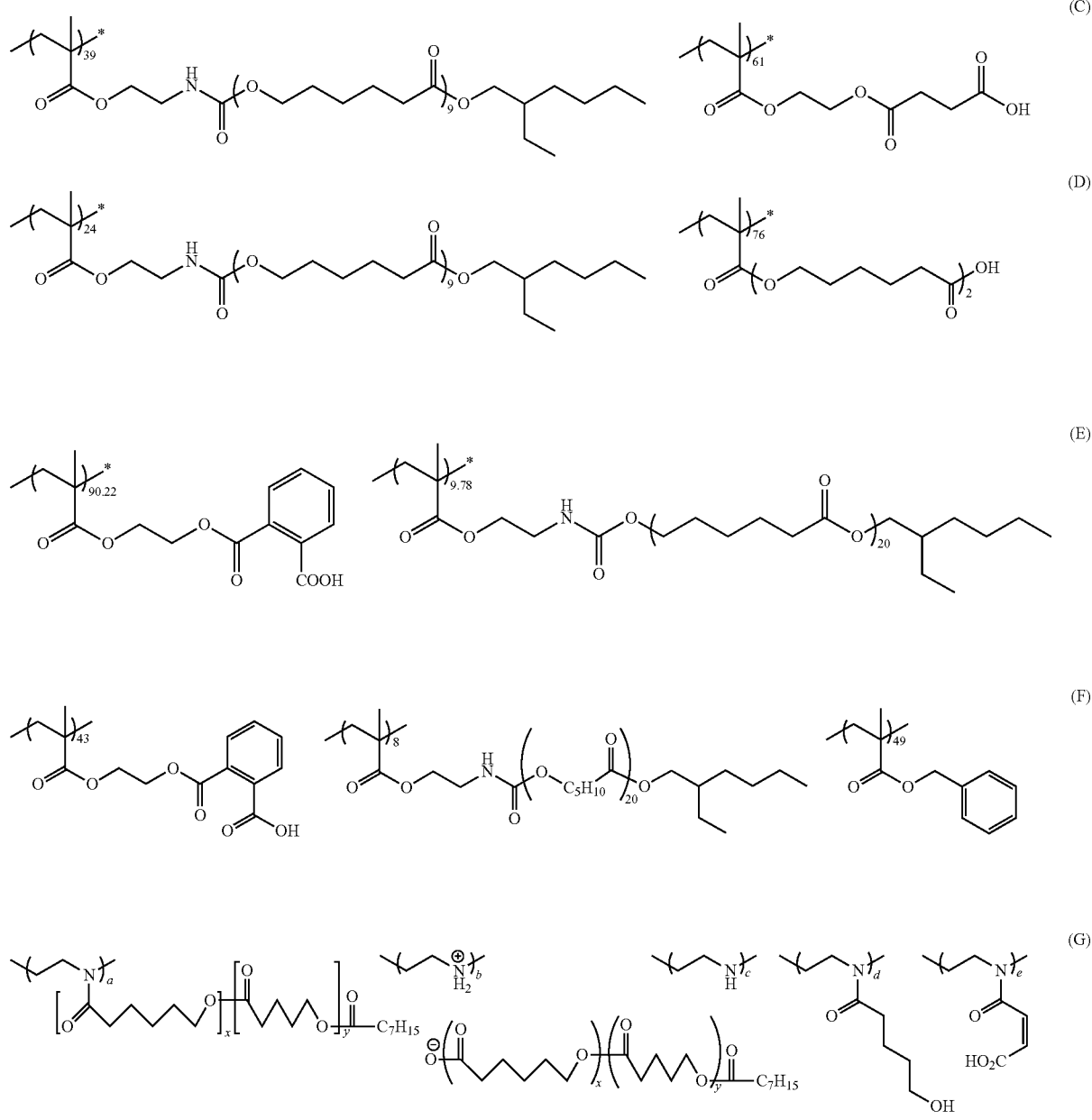

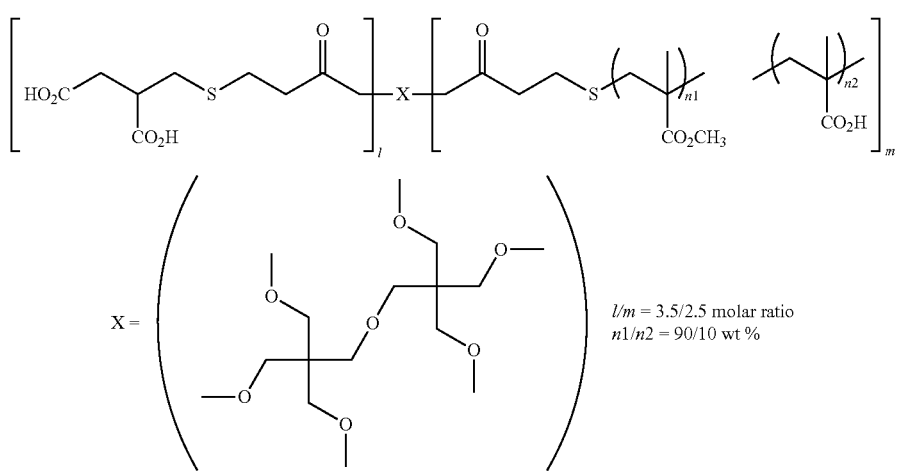

$l/m = 3.5/2.5$ molar ratio
$n1/n2 = 90/10$ wt%

A Dispersing agent I: A Solid content (a resin) contained in LPN-21116 (product name, manufactured by BYK Additives & Instruments (solid content: 40% by mass)).

The solid content (the resin) of the dispersing agent I is a resin containing structural units (1a) to (3a) shown below, which has an amine value of 75 mgKOH/g and an acid value of 0 mgKOH/g The dispersing agent H corresponds to a dispersing agent containing a radial structure.

Among the dispersing agents A to I, the dispersing agents A to H correspond to a dispersing agent containing an acid group.

The acid value (unit: mgKOH/g), the amine value (unit: mgKOH/g), and the molecular weight (the weight-average molecular weight) of the solid content of each of the dispersing agents A to I are as follows.

| Kind | Acid value | Amine value | Molecular weight |
|---|---|---|---|
| Dispersing agent A | 120 | — | more than 3,000 |
| Dispersing agent B | 50 | — | 35,000 |
| Dispersing agent C | 50 | — | 24,000 |
| Dispersing agent D | 75 | — | 2,0000 |
| Dispersing agent E | 100 | — | 4,0000 |
| Dispersing agent F | 60 | — | 33,000 |
| Dispersing agent G | 36 | 47 | 21,000 |
| Dispersing agent H | 190 | — | 11,000 |
| Dispersing agent I | — | 75 | more than 3,000 |

[Resin (Alkali-Soluble Resin)]

The resin (the alkali-soluble resin) shown below was used.

A-1: A resin having the following structure (solid content: 40%, solvent: propylene glycol monomethyl ether, see the structure below for the structure of the solid content (in terms of the resin), where the compositional ratio shown in the structure is the molar ratio, weight-average molecular weight of resin: 1,1000, acid value of resin: 70 mgKOH/g)

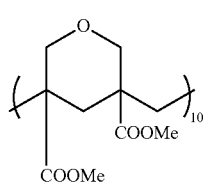
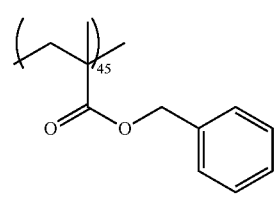

Among the dispersing agents A to I, the dispersing agents A to G and I correspond to a dispersing agent containing a graft structure.

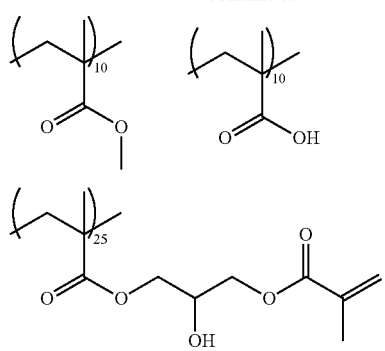

A-2: A copolymer of benzyl methacrylate and methacrylic acid (7:3, in terms of molar ratio) (weight-average molecular weight: 30,000, acid value: 112.8 mgKOH/g, a solution of 40% by mass of PGMEA)

[Polymerizable Compound]

The polymerizable compound shown below was used.

M1: A mixture of compounds having the following structure (the compositional ratio indicated in the structure is the mass ratio)

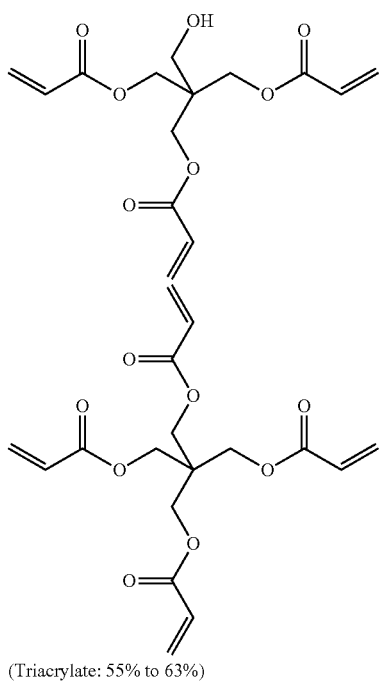

(Triacrylate: 55% to 63%)

M3: A compound having the following structure

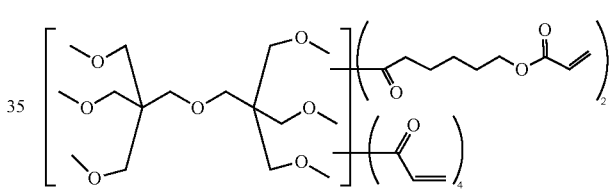

M4: A mixture of compounds having the following structures

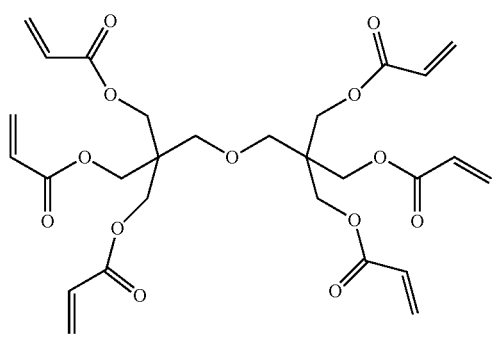

M1
(mixture of right structure:left structure = 7:3)

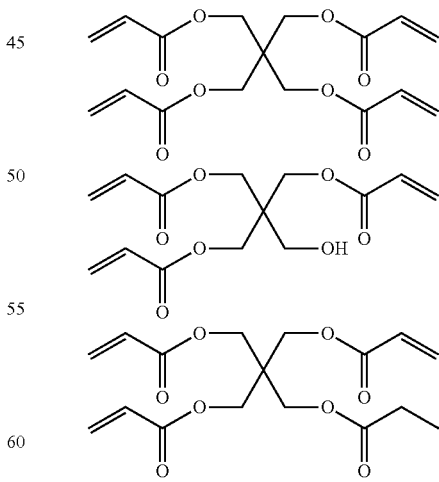

Mixture of above compounds (HPLC height ratio = 46.15:49.39:4.46)

M2: A mixture of compounds having the following structure (the compositional ratio indicated in the structure is in terms of % by mass)

[Photopolymerization Initiator]

The photopolymerization initiators shown below were used. In the polymerization initiators shown below, I-1 to I-8 are photopolymerization initiators which are oxime compounds. I-9 is a photopolymerization initiator other than the oxime compound.

- I-1: A polymerization initiator of Formula (I-1)
- I-2: Irgacure OXE01 (product name, manufactured by BASF Japan Ltd.)
- I-3: Irgacure OXE02 (product name, manufactured by BASF Japan Ltd.)
- I-4: A polymerization initiator of Formula (I-4)
- I-5: A polymerization initiator of Formula (I-5)
- I-6: A polymerization initiator of Formula (I-6)
- I-7: ADEKA ARKLS NCI-831 (manufactured by ADEKA CORPORATION)
- I-8: N-1919 (manufactured by ADEKA CORPORATION)
- I-9: Omnirad 907 (manufactured IGM Resins B.V.)

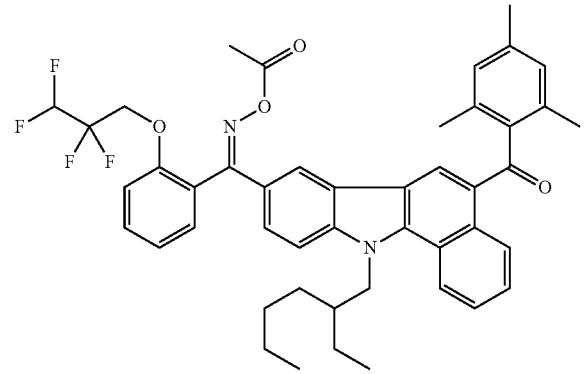

I-1

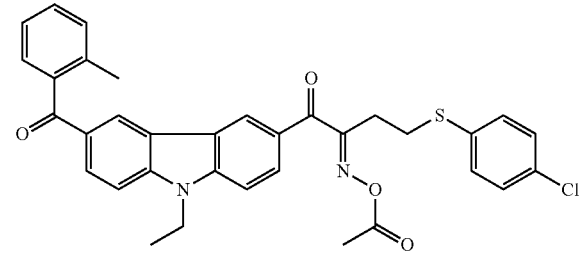

I-4

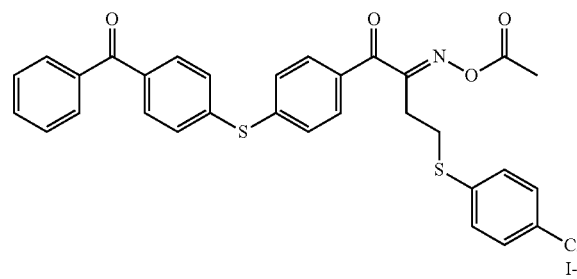

I-5

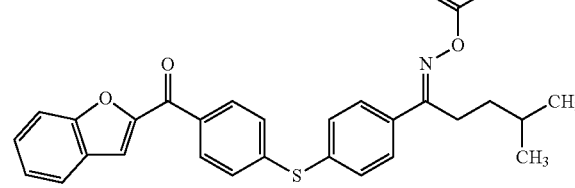

I-6

[Surfactant]

The surfactant shown below was used.

F-1: A surfactant (weight-average molecular weight (Mw) =15,311) represented by the following formula However, in the following formula, structural units represented by Formula (A) and (B) are 62% by mole and 38% by mole, respectively. In the structural unit represented by Formula (B), a, b, and c each satisfy relationships of $a+c=14$ and $b=17$.

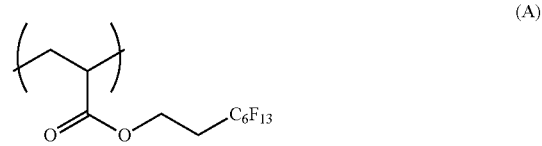

(A)

62%

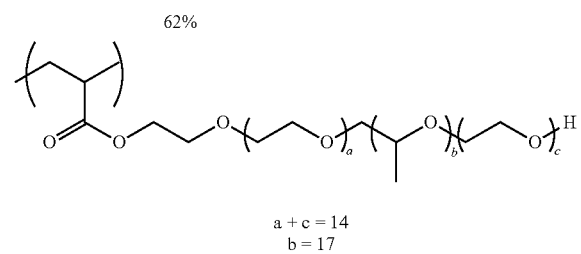

$a + c = 14$
$b = 17$ (B)

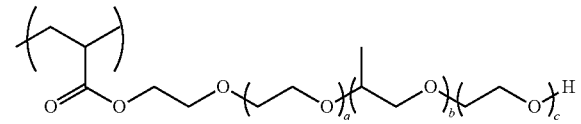

38%

[Polymerization Inhibitor]

The polymerization inhibitor shown below was used.

PI-1: p-methoxyphenol

[Organic Solvent]

The organic solvents shown below were used.

PGMEA: Propylene glycol monomethyl ether acetate

Cyclopentanone

[Preparation of Composition (Photosensitive Composition)]

A composition (a photosensitive composition) was prepared by the method described below.

<Preparation of Pigment Dispersion Liquid 1 (Dispersion Liquid 1)>

First, a pigment dispersion liquid (a dispersion liquid) was prepared.

The following components were mixed in the following formulation to prepare a dispersion liquid 1.

Particle: 25 parts by mass

A solution of 30% by mass of any one of the dispersing agents A to I: 25 parts by mass Cyclopentanone: 50 parts by mass It is noted that the above-described "particle" is any one kind of the particle described above or a mixed particle obtained by mixing two kinds of particles. Regarding the composition of the mixed particle, the mixed particle is a mixed particle obtained by mixing the above-described Z-14 and Ti-1 at a mass ratio of Z-14/Ti-1=70/30, a mixed particle obtained by mixing the above-described Z-14 and CB-1 at a mass ratio of Z-14/CB-1=70/30, or a mixed particle obtained by mixing the above-described Z-6 and Ti-1 at a mass ratio of Z-6/Ti-1=70/30.

The above-described "solution of 30% by mass of any one of the dispersing agents A to I" is a solution obtained by adding PGMEA to the above-described dispersing agents A to I so that the solid content (the resin) concentration is 30% by mass.

(Dispersion Conditions)

The mixture of the above components was subjected to a dispersion treatment using NPM-Pilot manufactured by Shinmaru Enterprises Corporation under the following conditions to obtain a dispersion liquid 1.

Bead diameter: φ0.05 mm, (YTZ, zirconia beads, manufactured by NIKKATO Corporation)
Bead filling rate: 65% by volume
Circumferential speed of mill: 10 m/sec
Circumferential speed of separator: 13 m/s
Amount of mixed solution subjected to dispersion treatment: 15 kg
Circulation flow rate (pump supply amount): 90 kg/hour
Temperature of treatment liquid: 45° C.
Cooling water: water
Treatment time: 22 hours <Preparation of Composition>

Each component of the dispersion liquid 1, the alkali-soluble resin, the polymerizable compound, the polymerization initiator, the surfactant, the polymerization inhibitor, and the PGMEA for adjusting the solid content concentration was mixed so that the solid content concentration of the composition was 32.5% by mass and the composition to be obtained satisfied the mass ratio of the solid content shown below, whereby the composition of each test example was prepared.

It is noted that hereinafter, even in a case of a component that has been added in a state of being dissolved in a solvent, the mass ratio of the target object to be added itself to the total solid content in the composition is shown. For example, in a case where the alkali-soluble resin is A-1, A-1 is provided for preparing the composition in a state where the alkali-soluble resin is dissolved in an organic solvent; however, in the following description, the mass ratio of the resin component (in terms of solid content) itself of the alkali-soluble resin A-1 is shown.

Further, in the preparation of the composition, two or more types of components of the same kind may be used, and in that case, the mass ratio of the total of the two or more types of components of the same kind is shown in the following description. For example, a composition may contain two or more types of particles, and in that case, the mass ratio of the total of the two or more types of particles is 60.

| Mass ratio | |
| --- | --- |
| Particle | 60 |
| Dispersing agent | 18 |
| Alkali-soluble resin | 1.48 |
| Polymerizable compound | 14.49 |
| Surfactant | 0.02 |
| Polymerization inhibitor | 0.01 |
| Polymerization initiator | 6.00 |
| Total | 100 |

[Evaluation]

Regarding the composition of each example, the following evaluations were carried out.

[Temporal Viscosity Stability (Dispersion Stability)]

50 g of the composition immediately after preparation was placed in a 100 mL glass container, the container was sealed, and the container was allowed to stand at 45° C. for 7 days. After being allowed to stand, the change in the viscosity of the composition before standing and after standing was measured, and the temporal viscosity stability (the dispersion stability) was evaluated according to the following criteria.

The change in viscosity was determined based on the viscosity before standing (100%).

In addition, the viscosity was measured in an environment of 25° C. using a cone plate type viscometer (manufactured by TOKI SANGYO Co., Ltd., model number: RE-85L).

A: The rate of change in viscosity was less than 5%.
B: The rate of change in viscosity was 5% or more and less than 10%.
C: The rate of change in viscosity was 10% or more and less than 15%.
D: The rate of change in viscosity was 15% or more.

[Electrode Anticorrosion Properties]

Each composition of Examples and Comparative Examples was applied with a spin coater onto an electrode pattern (copper) formed on the surface of a silicon wafer so that the dried film thickness of the coating film was 0.7 μm. After the coating, the silicon wafer on which each composition had been coated was left as it was for 10 minutes and then subjected to a heat treatment (pre-baking) for 120 seconds using a hot plate at 100° C. to form a coating film.

Next, the coating film was exposed using an i-line stepper exposure device FPA-3000i5+(manufactured by Canon Inc.) at a wavelength of 365 nm and an exposure amount of 500 mJ/cm$^2$ through a pattern mask having an island pattern of a size of 20 μm square.

Then, the silicon wafer on which the exposed coating film was formed was placed on a horizontal rotary table of a spin shower developing machine (DW-30 Type, manufactured by Chemitronics Co., Ltd.), and subjected to a puddle development at 23° C. for 60 seconds using CD-2000 (an organic alkali liquid developer, manufactured by FUJIFILM Electronic Materials Co., Ltd.).

Next, the silicon wafer after the puddle development was fixed to the horizontal rotary table by the vacuum chuck method and subjected to a rinse treatment by supplying pure water in a form of a shower from a spray nozzle from above the rotation center while rotating the silicon wafer at a rotation speed of 50 rpm by a rotation device. Then, the silicon wafer was subjected to spray drying to prepare a wafer having a frame-shaped black matrix.

After storing the wafer having a frame-shaped black matrix in an environment of a temperature of 25° C. and a humidity of 65% RH for 3 months, the number of places where rusting occurs in the electrode pattern was observed for 300 electrode pads formed on the non-exposed portions on the wafer, by using an optical microscope (manufactured by Olympus Corporation, product name: "LEXT OLS4500"). The electrode anticorrosion properties were evaluated according to the following criteria based on the number of places where rusting occurred.

A: There are 0 to 5 places where rusting occurs.
B: There are 6 to 10 places where rusting occurs
C: There are 11 to 20 places where rusting occurs
D: There are 21 or more places where rusting occurs

[Patterning Properties (Development Residue)]

Regarding a wafer having a frame-shaped black matrix obtained in the same manner as the test of the above-described "Electrode anticorrosion properties" non-exposed portions of the substrate surface were observed at a magnification of 20,000 times by using a scanning electron microscope (manufactured by Hitachi High-Technologies Corporation, product name: "SU8010"), the number of particulate residues confirmed in the obtained observation image was counted, and the patterning properties (the development residue) were evaluated according to the following criteria.

A: No development residue is observed in the non-exposed portions.
B: There are 1 to 49 particulate development residues in the non-exposed portions.
C: There are 50 to 100 particulate development residues in the non-exposed portions.
D: There are 101 or more particulate development residues in the non-exposed portions.

[Spectroscopic Properties (Light Shielding Properties)]

Each composition of Examples and Comparative Examples was applied onto a glass plate (Eagle XG, manufactured by Corning Inc.) having a thickness of 0.7 mm and an area of a square of 10 cm×10 cm by spin coating to form a coating film at a rotation speed at which the film thickness after drying became 1.5 µm. Then, the coating film was subjected to a heat treatment at 100° C. for 2 minutes by using a hot plate to obtain a dried film. The optical density (OD) of the obtained dried film was measured with a spectrophotometer U-4100 (manufactured by Hitachi High-Technologies Corporation). The spectroscopic properties (the light shielding properties) were evaluated according to the following criteria based on the minimum OD at a wavelength of 400 to 1,200 nm.

AA: Minimum OD>3.5
A: 3.5≥minimum OD>3.0
B: 3.0≥minimum OD>2.5
C: 2.5≥minimum OD>2.0
D: 2.0≥minimum OD

[Pattern Adhesiveness]

The composition was applied onto an 8-inch silicon wafer substrate by spin coating to form a coating film at a rotation speed at which a cured film having an optical density (OD) of 3 could be formed with respect to light having a wavelength of 940 nm. The coating film was subjected to a heat treatment at 100° C. for 2 minutes on a hot plate to obtain a dried film. Next, using an i-line stepper exposure device FPA-5510 iZa (manufactured by Canon Inc.), the dried film was exposed at an exposure amount of 500 mJ/cm² through a reticle with which a region of 20 µm×20 µm was exposed with light having a wavelength of 365 nm. Then, the silicon wafer substrate on which the exposed dried film was formed was placed on a horizontal rotary table of a spin shower developing machine (DW-30 Type, manufactured by Chemitronics Co., Ltd.), and subjected to a puddle development at 23° C. for 60 seconds using CD-2000 (an organic alkali liquid developer, manufactured by FUJIFILM Electronic Materials Co., Ltd.). Next, the silicon wafer substrate after the puddle development was fixed on the above horizontal rotary table by a vacuum chuck method, a rinse treatment was carried out by supplying pure water from a jet nozzle from above the rotation center in a shower-like manner while rotating the silicon wafer substrate at a rotation speed of 50 rpm by a rotating device, whereby a silicon wafer substrate having a pattern of 20 µm×20 µm formed on the substrate was produced. The obtained pattern-formed substrate was subjected to heat treatment at 220° C. for 1 hour using a clean oven (HIGH TEMPERATURE CLEAN OVEN CLH-300S, manufactured by Koyo Thermo Systems Co., Ltd.) to obtain a cured film (a substrate with a cured film).

The obtained cured film (the substrate with a cured film) was observed with a cross-sectional scanning electron microscope (SEM), and the adhesiveness of the pattern was evaluated according to the following criteria.

A: The width of the space between the cured film and the substrate (the width at which the peeling of the cured film has occurred) is 3 µm or less from the pattern edge.
B: The width of the space between the cured film and the substrate (the width at which the peeling of the cured film has occurred) is 3 µm or more and less than 5 µm from the pattern edge.
C: The width of the space between the cured film and the substrate (the width at which the peeling of the cured film has occurred) is 5 µm or more from the pattern edge.
D: A pattern of 20 µm×20 µm is peeled off, and thus measurement is impossible.

[Outgas]

A frame for a color filter was produced using each composition of Examples and Comparative Examples.

Specifically, each composition of Examples and Comparative Examples was subjected to spin coating on a semiconductor substrate, which is composed of an 8-inch substrate assuming an image sensor, so that the film thickness after pre-baking was 1.5 µm, whereby a coating film was formed. Subsequently, a binary mask capable of forming a light shielding film having a width of 250 µm and a height of 200 µm was arranged on the periphery of a side of 720 µm and a length of 520 µm, exposure (exposure amount: 500 mJ/cm²) was carried out using an i-line exposure device (FPA-3000+i5, manufactured by CANON INC.), and further, development was carried out.

The obtained semiconductor substrate having a plurality of frames for a color filter was cut into a size of 10 mm×10 mm, the Cl amount in the outgas was detected according to the thermal desorption spectroscopy (TDS), and the evaluation was carried out according to the following criteria. The count intensity ratio of the peak position, derived from Cl in the all outgas amounts (the detected total ion current values) at the mass numbers 1 to 199 in a case where the count derived from the atmospheric component contained in the background was canceled, was measured and evaluated according to the following criteria. The degree of vacuum at the time of measurement was set to $1 \times 10^{-7}$ Torr or less.

A: The Cl amount is 10 ppm by volume or less in 1 L of the outgas.
B: The Cl amount is more than 10 ppm by volume and 50 ppm by volume or less in 1 L of the outgas.
C: The Cl amount is more than 50 ppm by volume and 100 ppm by volume or less in 1 L of the outgas.
D: The Cl amount is more than 100 ppm by volume in 1 L of the outgas.

[Result]

The table below shows the formulation of the solid content and the characteristics of the composition used in each test example, as well as the test results thereof.

In the column of "Characteristics of Zr-containing particle" in the table, the column of "Zr", the column of "N", the column of "Fe", and the column of "Cl" indicates the contents (in terms of % by mass) of the respective atoms with respect to the total mass of the Zr particles (the zirconium-containing particles) used in the preparation of the composition.

In the column of "Characteristics of Zr-containing particles", the column of "Fe/Cl" indicates the mass ratio of the content of the Fe atom to the content of the Cl atom (the content mass of the Fe atom/the content mass of the Cl atom) in the Zr particle used in the preparation of the composition.

The column of "Oxime-based polymerization initiator" indicates whether or not the polymerization initiator used is an oxime-based photopolymerization initiator. In a case where the polymerization initiator was an oxime-based polymerization initiator, it was denoted as "A", and in a case where the polymerization initiator was not an oxime-based polymerization initiator, it was denoted as "B".

TABLE 2

|  |  |  | Example 1 | Example 2 | Example 3 | Example 4 | Example 5 |
|---|---|---|---|---|---|---|---|
| Kind of solid content | Particle | | Z-1 | Z-2 | Z-3 | Z-4 | Z-5 |
| | Dispersing agent | | B | B | B | B | B |
| | Alkali-soluble resin | | A-1 | A-1 | A-1 | A-1 | A-1 |
| | Polymerization initiator | | I-1 | I-1 | I-1 | I-1 | I-1 |
| | Polymerizable compound | | M1 | M1 | M1 | M1 | M1 |
| | Surfactant | | F-1 | F-1 | F-1 | F-1 | F-1 |
| | Polymerization inhibitor | | PI-1 | PI-1 | PI-1 | PI-1 | PI-1 |
| Characteristic | Characteristic of Zr particle | Zr | 48 | 47 | 47 | 47 | 47 |
| | | N | 33 | 33 | 33 | 32 | 32 |
| | | Fe | 0.003 | 0.020 | 0.030 | 0.100 | 0.150 |
| | | Cl | 0.100 | 0.100 | 0.100 | 0.100 | 0.100 |
| | | Fe/Cl | 0.030 | 0.200 | 0.300 | 1.000 | 1.500 |
| | | Coating layer | Absent | Absent | Absent | Absent | Absent |
| | Oxime-based polymerization initiator | | A | A | A | A | A |
| Evaluation | Electrode anticorrosion property | | A | A | A | A | A |
| | Patterning property (development residue) | | C | B | B | B | B |
| | Spectroscopic property | | A | A | A | A | A |
| | Outgas | | A | A | A | A | A |
| | Temporal viscosity stability | | A | A | A | A | A |
| | Pattern adhesiveness | | A | A | A | A | A |

|  |  |  | Example 6 | Example 7 | Example 8 | Example 9 | Example 10 |
|---|---|---|---|---|---|---|---|
| Kind of solid content | Particle | | Z-6 | Z-7 | Z-8 | Z-9 | Z-10 |
| | Dispersing agent | | B | B | B | B | B |
| | Alkali-soluble resin | | A-1 | A-1 | A-1 | A-1 | A-1 |
| | Polymerization initiator | | I-1 | I-1 | I-1 | I-1 | I-1 |
| | Polymerizable compound | | M1 | M1 | M1 | M1 | M1 |
| | Surfactant | | F-1 | F-1 | F-1 | F-1 | F-1 |
| | Polymerization inhibitor | | PI-1 | PI-1 | PI-1 | PI-1 | PI-1 |
| Characteristic | Characteristic of Zr particle | Zr | 47 | 47 | 48 | 47 | 47 |
| | | N | 32 | 32 | 33 | 33 | 33 |
| | | Fe | 0.200 | 0.250 | 0.300 | 0.020 | 0.020 |
| | | Cl | 0.100 | 0.100 | 0.100 | 0.150 | 0.200 |
| | | Fe/Cl | 2.000 | 2.500 | 3.000 | 0.133 | 0.100 |
| | | Coating layer | Absent | Absent | Absent | Absent | Absent |
| | Oxime-based polymerization initiator | | A | A | A | A | A |
| Evaluation | Electrode anticorrosion property | | B | B | C | A | A |
| | Patterning property (development residue) | | B | B | B | B | B |
| | Spectroscopic property | | A | A | A | A | A |
| | Outgas | | A | A | A | A | A |
| | Temporal viscosity stability | | A | A | A | A | A |
| | Pattern adhesiveness | | A | A | A | A | A |

TABLE 3

|  |  | Example 11 | Example 12 | Example 13 | Example 14 | Example 15 | Example 16 | Example 17 | Example 18 |
|---|---|---|---|---|---|---|---|---|---|
| Kind of solid content | Particle | Z-11 | Z-12 | Z-15 | Z-16 | Z-13 | Z-14 | Z-14/Ti-1 = 70/30 | Z-14/CB-1 = 70/30 |
| | Dispersing agent | B | B | B | B | B | B | B | B |
| | Alkali-soluble resin | A-1 | A-1 | A-1 | A-1 | A-1 | A-1 | A-1 | A-1 |
| | Polymerization initiator | I-1 | I-1 | I-1 | I-1 | I-1 | I-1 | I-1 | I-1 |
| | Polymerizable compound | M1 | M1 | M1 | M1 | M1 | M1 | M1 | M1 |
| | Surfactant | F-1 | F-1 | F-1 | F-1 | F-1 | F-1 | F-1 | F-1 |
| | Polymerization inhibitor | PI-1 | PI-1 | PI-1 | PI-1 | PI-1 | PI-1 | PI-1 | PI-1 |

TABLE 3-continued

|  |  |  | Example 11 | Example 12 | Example 13 | Example 14 | Example 15 | Example 16 | Example 17 | Example 18 |
|---|---|---|---|---|---|---|---|---|---|---|
| Characteristic | Characteristic of Zr particle | Zr | 47 | 47 | 47 | 47 | 47 | 47 | 47 | 47 |
|  |  | N | 33 | 33 | 33 | 33 | 33 | 33 | 33 | 33 |
|  |  | Fe | 0.020 | 0.020 | 0.300 | 0.003 | 0.019 | 0.019 | 0.019 | 0.019 |
|  |  | Cl | 0.270 | 0.460 | Less than 0.001 | 0.460 | 0.095 | 0.095 | 0.095 | 0.095 |
|  |  | Fe/Cl | 0.074 | 0.043 | More than 300 | 0.007 | 0.200 | 0.200 | 0.200 | 0.200 |
|  |  | Coating layer | Absent | Absent | Absent | Absent | Silica | Alumina | Alumina | Alumina |
| Evaluation | Oxime-based polymerization initiator |  | A | A | A | A | A | A | A | A |
|  | Electrode anticorrosion property |  | A | A | C | B | A | A | A | A |
|  | Patterning property (development residue) |  | B | B | C | C | A | A | A | A |
|  | Spectroscopic property |  | A | A | A | A | A | A | AA | AA |
|  | Outgas |  | B | C | A | C | A | A | A | A |
|  | Temporal viscosity stability |  | A | A | A | A | A | A | A | A |
|  | Pattern adhesiveness |  | A | A | A | A | A | A | A | A |

TABLE 4

|  |  |  | Example 19 | Example 20 | Example 21 | Example 22 | Example 23 | Example 24 | Example 25 | Example 26 | Example 27 |
|---|---|---|---|---|---|---|---|---|---|---|---|
| Kind of solid content | Particle |  | Z-2 | Z-2 | Z-2 | Z-2 | Z-2 | Z-2 | Z-2 | Z-2 | Z-2 |
|  | Dispersing agent |  | B | B | B | B | B | B | B | B | B |
|  | Alkali-soluble resin |  | A-2 | A-1 | A-1 | A-1 | A-1 | A-1 | A-1 | A-1 | A-1 |
|  | Polymerization initiator |  | I-1 | I-2 | I-3 | I-4 | I-5 | I-6 | I-7 | I-8 | I-9 |
|  | Polymerizable compound |  | M1 | M1 | M1 | M1 | M1 | M1 | M1 | M1 | M1 |
|  | Surfactant |  | F-1 | F-1 | F-1 | F-1 | F-1 | F-1 | F-1 | F-1 | F-1 |
|  | Polymerization inhibitor |  | PI-1 | PI-1 | PI-1 | PI-1 | PI-1 | PI-1 | PI-1 | PI-1 | PI-1 |
| Characteristic | Characteristic of Zr particle | Zr | 47 | 47 | 47 | 47 | 47 | 47 | 47 | 47 | 47 |
|  |  | N | 33 | 33 | 33 | 33 | 33 | 33 | 33 | 33 | 33 |
|  |  | Fe | 0.020 | 0.020 | 0.020 | 0.020 | 0.020 | 0.020 | 0.020 | 0.020 | 0.020 |
|  |  | Cl | 0.100 | 0.100 | 0.100 | 0.100 | 0.100 | 0.100 | 0.100 | 0.100 | 0.100 |
|  |  | Fe/Cl | 0.200 | 0.200 | 0.200 | 0.200 | 0.200 | 0.200 | 0.200 | 0.200 | 0.200 |
|  |  | Coating layer | Absent | Absent | Absent | Absent | Absent | Absent | Absent | Absent | Absent |
| Evaluation | Oxime-based polymerization initiator |  | A | A | A | A | A | A | A | A | B |
|  | Electrode anticorrosion property |  | A | A | A | A | A | A | A | A | A |
|  | Patterning property (development residue) |  | B | B | B | B | B | B | B | B | B |
|  | Spectroscopic property |  | A | A | A | A | A | A | A | A | A |
|  | Outgas |  | A | A | A | A | A | A | A | A | A |
|  | Temporal viscosity stability |  | A | A | A | A | A | A | A | A | A |
|  | Pattern adhesiveness |  | B | B | B | B | B | B | B | B | C |

TABLE 5

|  |  |  | Example 28 | Example 29 | Example 30 | Example 31 | Example 32 | Example 33 | Example 34 |
|---|---|---|---|---|---|---|---|---|---|
| Kind of solid content | Particle |  | Z-6/Ti-1 = 70/30 | Z-6/Ti-1 = 70/30 | Z-6/Ti-1 = 70/30 | Z-6/Ti-1 = 70/30 | Z-6/Ti-1 = 70/30 | Z-6/Ti-1 = 70/30 | Z-6/Ti-1 = 70/30 |
|  | Dispersing agent |  | B | A | C | D | E | F | G |
|  | Alkali-soluble resin |  | A-1 | A-1 | A-1 | A-1 | A-1 | A-1 | A-1 |
|  | Polymerization initiator |  | I-1 | I-1 | I-1 | I-1 | I-1 | I-1 | I-1 |
|  | Polymerizable compound |  | M1 | M1 | M1 | M1 | M1 | M1 | M1 |
|  | Surfactant |  | F-1 | F-1 | F-1 | F-1 | F-1 | F-1 | F-1 |
|  | Polymerization inhibitor |  | PI-1 | PI-1 | PI-1 | PI-1 | PI-1 | PI-1 | PI-1 |
| Characteristic | Characteristic of Zr particle | Zr | 47 | 47 | 47 | 47 | 47 | 47 | 47 |
|  |  | N | 32 | 32 | 32 | 32 | 32 | 32 | 32 |
|  |  | Fe | 0.200 | 0.200 | 0.200 | 0.200 | 0.200 | 0.200 | 0.200 |
|  |  | Cl | 0.100 | 0.100 | 0.100 | 0.100 | 0.100 | 0.100 | 0.100 |
|  |  | Fe/Cl | 2.000 | 2.000 | 2.000 | 2.000 | 2.000 | 2.000 | 2.000 |
|  |  | Coating layer | Absent | Absent | Absent | Absent | Absent | Absent | Absent |
|  | Oxime-based polymerization initiator |  | A | A | A | A | A | A | A |

TABLE 5-continued

|  |  | Example 28 | Example 29 | Example 30 | Example 31 | Example 32 | Example 33 | Example 34 |
|---|---|---|---|---|---|---|---|---|
| Evaluation | Electrode anticorrosion property | A | A | A | A | A | A | A |
|  | Patterning property (development residue) | B | B | B | B | B | B | B |
|  | Spectroscopic property | A | A | A | A | A | A | A |
|  | Outgas | A | A | A | A | A | A | A |
|  | Temporal viscosity stability | A | A | A | A | A | A | B |
|  | Pattern adhesiveness | A | A | A | A | A | A | A |

TABLE 6

|  |  |  | Example 35 | Example 36 | Example 37 | Example 38 | Example 39 | Example 40 | Example 1 | Example 2 |
|---|---|---|---|---|---|---|---|---|---|---|
| Kind of solid content | Particle |  | Z-6/Ti-1 = 70/30 | Z-6/Ti-1 = 70/30 | Z-6/Ti-1 = 70/30 | Z-6/Ti-1 = 70/30 | Z-6/Ti-1 = 70/30 | Z-6/Ti-1 = 70/30 | ZZ-1 | ZZ-2 |
|  | Dispersing agent |  | H | I | B | B | B | B | B | B |
|  | Alkali-soluble resin |  | A-1 | A-1 | A-1 | A-1 | A-1 | A-1 | A-1 | A-1 |
|  | Polymerization initiator |  | I-1 | I-1 | I-1 | I-1 | I-1 | I-1 | I-1 | I-1 |
|  | Polymerizable compound |  | M1 | M1 | M1 | M1 | M1 | M2/M4 = 83/17 | M1 | M1 |
|  | Surfactant |  | F-1 | F-1 | F-1 | F-1 | F-1 | F-1 | F-1 | F-1 |
|  | Polymerization inhibitor |  | PI-1 | PI-1 | PI-1 | PI-1 | PI-1 | PI-1 | PI-1 | PI-1 |
| Characteristic | Characteristic of Zr particle | Zr | 47 | 47 | 47 | 47 | 47 | 47 | 48 | 48 |
|  |  | N | 32 | 32 | 32 | 32 | 32 | 32 | 33 | 33 |
|  |  | Fe | 0.200 | 0.200 | 0.200 | 0.200 | 0.200 | 0.200 | Less than 0.001 | 0.420 |
|  |  | Cl | 0.100 | 0.100 | 0.100 | 0.100 | 0.100 | 0.100 | 0.100 | 0.100 |
|  |  | Fe/Cl | 2.000 | 2.000 | 2.000 | 2.000 | 2.000 | 2.000 | Less than 0.01 | 4.200 |
|  | Coating layer |  | Absent | Absent | Absent | Absent | Absent | Absent | Absent | Absent |
|  | Oxime-based polymerization initiator |  | A | A | A | A | A | A | A | A |
| Evaluation | Electrode anticorrosion property |  | A | A | A | A | A | A | A | D |
|  | Patterning property (Development residue) |  | B | B | B | B | B | B | D | B |
|  | Spectroscopic property |  | A | A | A | A | A | A | A | A |
|  | Outgas |  | A | A | A | A | A | A | A | A |
|  | Temporal viscosity stability |  | A | B | A | A | A | A | A | A |
|  | Pattern adhesiveness |  | A | A | A | A | A | A | A | A |

From the results shown in the table, it was confirmed that the problems of the present invention can be solved by using the composition of the embodiment of the present invention.

Among the above, it was confirmed that the photopolymerization initiator is preferably an oxime compound and more preferably a polymerization initiator represented by Formula (I-1) from the viewpoint that the effect of the present invention is more excellent (see the comparison between results of Examples 2, and 19 to 27, and the like).

It was confirmed that the content of the Cl atom is preferably 0.001 to 0.300% by mass with respect to the total mass of the zirconium nitride-based particle from the viewpoint that the effect of the present invention is more excellent (see the comparison between Examples 11 and 12, the comparison between Examples 8 and 13, and the like).

It was confirmed that the zirconium nitride-based particle preferably contains 0.010% to 0.150% by mass of the Fe atom with respect to the total mass of the zirconium nitride-based particle from the viewpoint that the effect of the present invention is more excellent (see the comparison between Examples 1 to 6, and the like).

It was confirmed that in the zirconium nitride-based particle, the mass ratio (Fe/Cl) of the content of the Fe atom to the content of the Cl atom is preferably 0.008 to 1.5 from the viewpoint that the effect of the present invention is more excellent (see the comparison between Examples 5 and 6, the comparison between Examples 1 and 14, and the like).

It was confirmed that a black pigment is preferably further contained from the viewpoint that the effect of the present invention is more excellent (see the results of Examples 17 and 18, and the like).

It was confirmed that the amine value of the dispersing agent is preferably 0 to 25 mgKOH/g from the viewpoint that the effect of the present invention is more excellent (see the comparison between Examples 28 to 36, and the like).

It was confirmed that the zirconium nitride-based particle preferably contains a core portion containing one or more selected from the group consisting of zirconium nitride and zirconium oxynitride, and a metal oxide coating layer consisting of a metal oxide that covers the core portion from the viewpoint that the effect of the present invention is more excellent (see the results of Examples 13 and 14, and the like).

It was confirmed that the alkali-soluble resin preferably has a curable group (an ethylenically unsaturated group such as a (meth)acryloyl group) from the viewpoint that the effect of the present invention is more excellent (see the comparison between Examples 2 and 19, and the like).

Similar results can be obtained even in a case where zirconium nitride is used instead of zirconium oxynitride. Similar results can be obtained even in a case where a surfactant is not added. Similar results can be obtained even in a case where a polymerization inhibitor is not added.

Similar results can be obtained even in a case where the polymerization initiators I-1 and 1-2 are not used in combination.

<<Test Y>>

[Application to Various Use Applications]

By the method described below, the applicability of the compositions of Examples used in <<Test X>> described above to various use applications was checked.

[Production and Evaluation of Light Shielding Film for Wafer-Level Lens]

A lens film was formed by the following operations.

1. Formation of Thermosetting Cured Film

A curable composition for a lens (composition obtained by adding 1% by mass of an aryl sulfonium salt derivative (manufactured by ADEKA CORPORATION, SP-172) to an alicyclic epoxy resin (produced by Daicel Corporation, EHPE-3150)) (2 mL) was applied onto a glass substrate (thickness of 1 mm, manufactured by SCHOTT AG, BK7) of 5×5 cm, and the coating film was cured by heating at 200° C. for 1 minute to form a film with which residues on the lens could be evaluated.

2. Evaluation on Lens

The composition of Example used in <<Test X>> described above was applied onto the glass substrate [the support] on which the lens film had been formed, and the support onto which the composition had been applied was heated for 120 seconds with a hot plate having a surface temperature of 120° C. In this way, a coating film [a composition layer] having a film thickness of 2.0 µm was obtained.

<Exposure Step>

Next, using a high-pressure mercury lamp, the obtained composition layer was exposed at an exposure amount of 500 mJ/cm² through a photo mask having a hole pattern of 10 mm.

<Development Step>

The composition layer after exposure was subjected to puddle development at a temperature of 23° C. for 60 seconds using an aqueous solution of 0.3% of tetramethylammonium hydroxide. Then, the composition layer subjected to the development treatment was rinsed with a spin shower, and the composition layer subjected to the rinse treatment with pure water was further washed with water to obtain a patterned light shielding film (a cured film)

[Production and Evaluation of Solid-State Imaging Device]

On the substrate on which the patterned light shielding film formed as described above had been formed, a curable resin layer was formed using a curable composition for a lens (a composition obtained by adding 1% by mass of an awl sulfonium salt derivative (manufactured by ADEKA CORPORATION, SP-172) to an alicyclic epoxy resin (manufactured by Daicel Corporation, EHPE-3150)), a shape was transferred with a quartz mold having a lens shape, and the curable resin layer was cured at an exposure amount of 400 mJ/cm² with a high-pressure mercury lamp, whereby a wafer-level lens array having a plurality of wafer-level lenses was produced.

The produced wafer-level lens array was cut, a lens module was produced using the obtained wafer-level lens, and then an imaging element and a sensor substrate were attached thereto to produce an imaging unit.

The obtained wafer-level lens was such a lens in which residues were not present in the lens opening portion, transmittance was good, and the light shielding layer had high uniformity of the coated surface and high light shielding properties.

[Production of Color Filter Having Black Matrix]

<Formation of Black Matrix>

The composition of Example used in <<Test X>> described above, obtained as above, was applied onto a glass wafer by a spin coating method, and then the glass wafer was heated at 120° C. for 2 minutes on a hot plate to obtain a coating film [a composition layer]. The rotation speed by spin coating was adjusted so that the film thickness of the coating film was 2.0 µm.

Next, the obtained composition layer was exposed through a photo mask of which the pattern had an island pattern of 0.1 mm at an exposure amount of 500 mJ/cm² using an i-line stepper.

The composition layer after exposure was subjected to puddle development at 23° C. for 60 seconds using an aqueous solution of 0.3% of tetramethylammonium hydroxide. Then, the composition layer subjected to the development treatment was rinsed with a spin shower, and the composition layer subjected to the rinse treatment with pure water was further washed with water to obtain a patterned light shielding film (a black matrix).

<Preparation of Chromatic Curable Composition>

Each of a curable coloration composition R-1 for red (R), a curable coloration composition G-1 for green (G), and a curable coloration composition B-1 for blue (B) was prepared in the same manner except that in the composition of Example 1 in <<Test X>> described above, Z-1 in the dispersion liquid 1 was replaced with the following chromatic pigment.

A chromatic pigment for forming colored pixel of each RGB color

Pigment for Red (R)

C. I. Pigment Red 254

Pigment for Green (G)

A 30/70 [in terms of mass ratio] mixture of C. I. Pigment Green 36 and C. I. Pigment Yellow 219

Pigment for Blue (B)

A 30/70 [in terms of mass ratio] mixture of C. I. Pigment Blue 15:6 and C. I. Pigment Violet 23

<Production of Color Filter>

In the black matrix produced as described above, the curable coloration composition R-1 for red (R) was used to form a red (R) coloration pattern of 80×80 µm in the same manner as in the method of producing the black matrix produced as described above. Further, similarly, the curable coloration composition G-1 for green (G) was used to form a green (G) chromatic coloration pattern, and sequentially the curable coloration composition B-1 for blue (B) was used to form a blue (B) chromatic coloration pattern, whereby a color filter having a black matrix for a liquid crystal display device was produced.

It was confirmed that the composition according to the embodiment of the present invention can also be applied to a black matrix for a color filter.

EXPLANATION OF REFERENCES

10: headlight unit
12: light source
14: light shielding unit
16: lens
20: base body
22: light shielding film
23: opening portion
30: light distribution pattern
30a: edge
31: region
32: light distribution pattern 32a: edge
33: notched portion
34: region
100: solid-state imaging device
101: solid-state imaging element
102: imaging unit
103: cover glass
104: spacer
105: laminated substrate
106: chip substrate
107: circuit board
108: electrode pad
109: external connection terminal
110: through-electrode
111: lens layer
112: lens material
113: support
114, 115: light shielding film
201: light-receiving element
202: color filter
203: micro lens
204: substrate
205b: blue pixel
205r: red pixel
205g: green pixel
205bm: black matrix
206: p-well layer
207: reading gate part
208: vertical electric charge transfer path
209: element separation region
210: gate insulating film
211: vertical electric charge transfer electrode
212: light shielding film
213, 214: insulating film
215: planarization film
300: infrared sensor
310: solid-state imaging element
311: infrared absorption filter
312: color filter
313: infrared transmitting filter
314: resin film
315: micro lens
316: planarization film

What is claimed is:

1. A photosensitive composition comprising:
a zirconium nitride-based particle containing one or more selected from the group consisting of zirconium nitride and zirconium oxynitride;
a resin;
a polymerizable compound; and
a photopolymerization initiator,
wherein the zirconium nitride-based particle contains 0.001% to 0.400% by mass of a Fe atom with respect to a total mass of the zirconium nitride-based particle,
wherein the zirconium nitride-based particle contains 0.001% to 0.500% by mass of a Cl atom with respect to a total mass of the zirconium nitride-based particle, and
wherein a mass ratio of the Fe atom to the Cl atom in the zirconium nitride-based particle is 0.007 to 3.000.

2. The photosensitive composition according to claim 1, wherein the zirconium nitride-based particle contains 0.010% to 0.150% by mass of the Fe atom with respect to the total mass of the zirconium nitride-based particle.

3. The photosensitive composition according to claim 1, wherein a content of the Cl atom is 0.001% to 0.300% by mass with respect to the total mass of the zirconium nitride-based particle.

4. The photosensitive composition according to claim 1, wherein in the zirconium nitride-based particle, a mass ratio of a content of the Fe atom to a content of the Cl atom is 0.008 to 1.5.

5. The photosensitive composition according to claim 1, wherein the zirconium nitride-based particle contains a core portion containing one or more selected from the group consisting of zirconium nitride and zirconium oxynitride, and a metal oxide coating layer consisting of a metal oxide that covers the core portion.

6. The photosensitive composition according to claim 5, wherein the metal oxide includes silica or alumina.

7. The photosensitive composition according to claim 5, wherein a content of the metal oxide coating layer is 3% to 7% by mass with respect to the total mass of the zirconium nitride-based particle.

8. The photosensitive composition according to claim 1, further comprising a black pigment.

9. A method of forming a cured film, comprising
applying the photosensitive composition according to claim 1 on a support to form a layer,
exposing and curing the layer by irradiation with actinic rays or radiation, and
developing the layer to form the cured film.

10. A light shielding film that is the cured film formed according to the method of claim 9.

11. A color filter comprising the cured film formed according to the method of claim 9.

12. An optical element comprising the cured film formed according to the method of claim 9.

13. A solid-state imaging element comprising the cured film formed according to the method of claim 9.

14. An infrared sensor comprising the cured film formed according to the method of claim 9.

15. A headlight unit for a vehicle, comprising:
a light source; and
a light shielding unit that shields at least a part of light emitted from the light source,
wherein the light shielding unit includes the cured film formed according to the method of claim 9.

16. The photosensitive composition according to claim 2, wherein the zirconium nitride-based particle contains a core portion containing one or more selected from the group consisting of zirconium nitride and zirconium oxynitride, and a metal oxide coating layer consisting of a metal oxide that covers the core portion.

* * * * *